(12) United States Patent
Park et al.

(10) Patent No.: US 11,064,603 B2
(45) Date of Patent: Jul. 13, 2021

(54) ELECTRONIC APPARATUS HAVING PACKAGE BASE SUBSTRATE

(71) Applicant: SAMSUNG ELECTRONICS CO., LTD., Suwon-si (KR)

(72) Inventors: Ji-woon Park, Suwon-si (KR); Jin-an Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 84 days.

(21) Appl. No.: 16/270,874

(22) Filed: Feb. 8, 2019

(65) Prior Publication Data
US 2019/0357351 A1 Nov. 21, 2019

(30) Foreign Application Priority Data
May 21, 2018 (KR) .................. 10-2018-0057990

(51) Int. Cl.
| | |
|---|---|
| *H05K 1/02* | (2006.01) |
| *H01L 25/18* | (2006.01) |
| *H01L 23/538* | (2006.01) |
| *H01L 23/66* | (2006.01) |
| *H05K 1/18* | (2006.01) |

(52) U.S. Cl.
CPC ....... *H05K 1/0251* (2013.01); *H01L 23/5386* (2013.01); *H01L 23/66* (2013.01); *H01L 25/18* (2013.01); *H05K 1/181* (2013.01); *H01L 2223/6616* (2013.01); *H05K 2201/0776* (2013.01); *H05K 2201/09672* (2013.01); *H05K 2201/10189* (2013.01)

(58) Field of Classification Search
CPC .... H05K 1/11; H05K 1/14; H05K 1/141–144; H05K 1/18; H05K 1/181–188; H05K 1/0246; H05K 3/36; H05K 2201/0715; H05K 2201/0936; H01L 23/50; H01L 23/538; H01L 23/552; H01L 23/5358; H01L 23/3128
USPC ......... 361/760–764, 782–784, 792–795, 803
See application file for complete search history.

(56) References Cited

U.S. PATENT DOCUMENTS

| | | | | |
|---|---|---|---|---|
| 5,483,421 | A * | 1/1996 | Gedney | H01L 23/145 174/255 |
| 6,323,436 | B1 * | 11/2001 | Hedrick | H01L 23/145 174/255 |
| 6,456,502 | B1 * | 9/2002 | Miller | H05K 1/023 174/250 |
| 6,556,099 | B2 | 4/2003 | Khan et al. | |

(Continued)

FOREIGN PATENT DOCUMENTS

| | | |
|---|---|---|
| JP | 2006-351647 A | 12/2006 |
| JP | 2009-239182 A | 10/2009 |

*Primary Examiner* — Tuan T Dinh
(74) *Attorney, Agent, or Firm* — Sughrue Mion, PLLC

(57) ABSTRACT

Provided is an electronic apparatus capable of improving time margin. The electronic apparatus includes: a base substrate including a substrate base including a plurality of layers and a plurality of wiring layers between the layers; a controller chip and at least one memory semiconductor chip mounted on the base substrate; a signal line disposed in one of the wiring layers and connecting the controller chip to the at least one memory semiconductor chip; and a pair of open stubs disposed in another wiring layer, connected to both ends of the signal line, and extending to face each other with a gap.

19 Claims, 19 Drawing Sheets

(56) References Cited

U.S. PATENT DOCUMENTS

| | | | |
|---|---|---|---|
| 6,842,347 B2* | 1/2005 | Chang | H01L 23/3128 |
| | | | 257/700 |
| 7,564,695 B2 | 7/2009 | Matsumoto | |
| 7,578,472 B2* | 8/2009 | Mastrolia | B64D 25/10 |
| | | | 244/122 A |
| 7,612,634 B2 | 11/2009 | Iwata | |
| 7,741,876 B2 | 6/2010 | Fusayasu et al. | |
| 7,800,918 B2 | 9/2010 | Saeki | |
| 8,841,561 B1* | 9/2014 | Jiang | H05K 1/0219 |
| | | | 174/262 |
| 9,276,549 B1 | 3/2016 | Cheng et al. | |
| 9,894,751 B2 | 2/2018 | Murai et al. | |
| 2007/0130555 A1* | 6/2007 | Osaka | H04L 25/08 |
| | | | 439/14 |
| 2007/0205498 A1 | 9/2007 | Djordjevic et al. | |
| 2008/0289177 A1* | 11/2008 | Lee | H01L 21/481 |
| | | | 29/847 |
| 2010/0096174 A1* | 4/2010 | Nakano | H05K 1/0216 |
| | | | 174/260 |
| 2011/0226516 A1* | 9/2011 | Takeda | H05K 1/0231 |
| | | | 174/260 |
| 2011/0317372 A1* | 12/2011 | Nomoto | G11C 5/04 |
| | | | 361/729 |
| 2012/0261178 A1* | 10/2012 | Kusumoto | H05K 3/0005 |
| | | | 174/262 |
| 2013/0003333 A1* | 1/2013 | Toyao | H05K 1/0298 |
| | | | 361/777 |
| 2013/0135916 A1* | 5/2013 | Osanai | G11C 7/1057 |
| | | | 365/51 |
| 2014/0016686 A1 | 1/2014 | Ben Artsi | |
| 2015/0222003 A1* | 8/2015 | Fujita | H01P 3/08 |
| | | | 333/238 |
| 2017/0064814 A1 | 3/2017 | Kawaguchi | |

* cited by examiner

ELECTRONIC APPARATUS HAVING PACKAGE BASE SUBSTRATE

CROSS-REFERENCE TO THE RELATED APPLICATION

This application claims priority from Korean Patent Application No. 10-2018-0057990, filed on May 21, 2018, in the Korean Intellectual Property Office, the disclosure of which is incorporated herein in its entirety by reference.

BACKGROUND

Example embodiments of the inventive concept relate to an electronic apparatus, and more particularly, to an electronic apparatus having a base substrate.

Electronic apparatuses are being miniaturized and increased in capacity according to the rapid development of the electronic industry and user demands. However, increase in capacities of semiconductor memory chips are not able to meet such demands. As a result, the number of semiconductor memory chips connected to one channel of an electronic apparatus is increased, and thus, the time margin decreases.

SUMMARY

Example embodiments of the inventive concept provide an electronic apparatus capable of improving time margin.

To accomplish the technical object, the example embodiments of the inventive concept provide electronic apparatuses as described below.

According to an example embodiment, there is provided an electronic apparatus which may include: a base substrate including a substrate base including a plurality of layers and a plurality of wiring layers disposed between the layers; a controller chip and at least one memory semiconductor chip mounted on the base substrate; at least one first signal line disposed in a first wiring layer in the substrate base from among the wiring layers and connecting the controller chip to the memory semiconductor chip; at least one pair of open stubs disposed in a second wiring layer in the substrate base from among the wiring layers, connected to the both ends of the first signal line, and apart from each other; and a plurality of vias penetrating through portions of the substrate base to connect both ends of the first signal line and the pair of open stubs.

According to an example embodiment, there is provided an electronic apparatus which may include: a base substrate including a substrate base including a plurality of layers and a plurality of wiring layers disposed between the layers, wherein the layers comprise a first ground wiring layer, a second ground wiring layer, a first signal wiring layer, and a second signal wiring layer, and wherein the first signal wiring layer and the second signal wiring layer are disposed between the first ground wiring layer and the second ground wiring layer; and a plurality of semiconductor chips mounted on the base substrate. The base substrate may include: ground plane layers respectively disposed in the first ground wiring layer and the second ground wiring layer; a signal line disposed in the first signal wiring layer and connecting two of the semiconductor chips; a pair of open stubs disposed in the second signal wiring layer and connected to both ends of the signal line; and a plurality of vias penetrating a portion of the substrate base to connect both ends of the signal line and the pair of open stubs.

According to an example embodiment, there is provided an electronic apparatus which may include: a base substrate including a substrate base including a plurality of layers and a plurality of wiring layers disposed between the layers; at least one semiconductor chip mounted on the base substrate; at least one signal line disposed in a first wiring layer among the wiring layers and connected to the at least one semiconductor chip; and a pair of open stubs disposed in at least one second wiring layer among the wiring layers, connected to both ends of the signal line, and extending to face each other across a gap.

BRIEF DESCRIPTION OF THE DRAWINGS

Example embodiments of the inventive concept will be more clearly understood from the following detailed description taken in conjunction with the accompanying drawings, in which.

DETAILED DESCRIPTION OF THE EXAMPLE EMBODIMENTS

Figure 1:
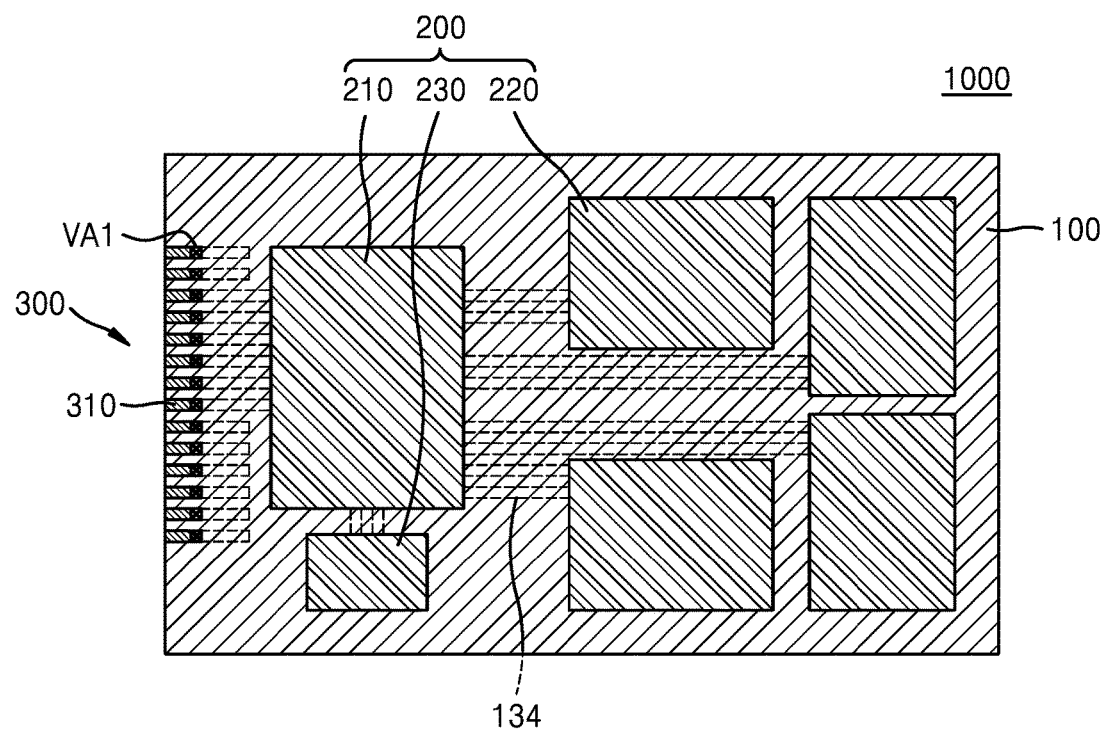
FIG. 1 is a plan view of main components of an electronic apparatus according to an example embodiment.

Various example embodiments of the inventive concept will be described more fully hereinafter with reference to the accompanying drawings. The inventive concept may, however, be embodied in many different forms and should not be construed as limited to the example embodiments set forth herein. Rather, these example embodiments are provided so that this description will be thorough and complete, and will fully convey the scope of the inventive concept to those skilled in the art. In the drawings, the sizes and relative sizes of layers and regions may be exaggerated for clarity. However, an example embodiment provided in the following description is not excluded from being associated with one or more features of another example embodiment also provided therein or not provided therein but consistent with the inventive concept. For example, even if matters described in a specific example are not described in a different example thereto, the matters may be understood as being related to the other example, unless otherwise mentioned in descriptions thereof.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present Like numerals refer to like elements throughout. As used herein, the term "and/or" includes any and all combinations of one or more of the associated listed items.

Spatially relative terms, such as "beneath," "below," "lower," "over," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plan view of main components of an electronic apparatus according to an example embodiment.

Referring to FIG. 1, an electronic apparatus 1000 includes a base substrate 100, a plurality of semiconductor chips 200 mounted on the base substrate 100, and an input/output interface 300. According to some example embodiments, the electronic apparatus 1000 may be, but is not limited to, a solid state drive device.

According to some example embodiments, the base substrate 100 may be a printed circuit board. For example, the base substrate 100 may be a multi-layer printed circuit board. The main components of the base substrate 100 are substantially identical to those of a base substrate 100a described below in FIG. 2A, and thus, detailed descriptions thereof will be omitted. A plurality of wiring patterns 134 may be disposed in the base substrate 100. According to some example embodiments, the wiring patterns 134 may be disposed in a top surface and/or a bottom surface of the base substrate 100.

Each of the semiconductor chips 200 may include a semiconductor substrate. The semiconductor substrate may include, for example, silicon (Si). Alternatively, the semiconductor substrate may include a semiconductor element like germanium (Ge) or a compound semiconductor like silicon carbide (SiC), gallium arsenide (GaAs), indium arsenide (InAs), and indium phosphide. The semiconductor substrate may have an active surface and an inactive surface opposite to the active surface. In each of the semiconductor chips 200, a semiconductor device including a plurality of individual devices of various types may be disposed in the active surface.

The semiconductor chips 200 may include a controller chip 210, a plurality of first memory semiconductor chips 220, and at least one second memory semiconductor chip 230.

The controller chip 210 may control the first memory semiconductor chips 220 and the at least one second memory semiconductor chip 230. A controller may be embedded in the controller chip 210. The controller may control access to data stored in the first memory semiconductor chips 220 and the at least one second memory semiconductor chip 230. The controller may control write/read operations with respect to the first memory semiconductor chips 220 according to control commands from an external host. The controller may be or include a separate control semiconductor chip like an application specific integrated circuit (ASIC). For example, the controller may be designed to be automatically operated by an operating system of the external host when the electronic apparatus 1000 is connected to the external host. The controller may provide standard protocols like parallel advanced technology attachment (PATA), serial advanced technology attachment (SATA), small computer system interface (SCSI), or PCI Express (PCIe). The controller may also perform wear leveling, garbage collection, bad block management, and error correcting coding (ECC) for a non-volatile memory device. In this case, the controller may include a script for automatic operation and an application program executable by the external host.

The first memory semiconductor chips 220 may be non-volatile memory devices. For example, the non-volatile memory device may include, but is not limited to, a flash memory, phase change RAM (PRAM), resistive RAM (RRAM), ferroelectric RAM (FeRAM), or magnetic RAM (MRAM). The flash memory may be, for example, a NAND flash memory. The flash memory may be, for example, a V-NAND flash memory. The non-volatile memory device may include one semiconductor die or may be a stack of a plurality of semiconductor dies.

The at least one second memory semiconductor chip 230 may be a volatile memory device. For example, the volatile memory device may be, but is not limited to, dynamic random access memory (DRAM), static random access memory (SRAM), synchronous DRAM (SDRAM), double data rate random access memory (DDR RAM), or Rambus DRAM (RDRAM). The volatile memory device provides a cache function for storing data that is frequently used when the external host accesses the electronic apparatus 1000, thereby scaling an access time and data-transfer performance in correspondence to processing efficiency of the external host connected to the electronic apparatus 1000.

The input/output interface 300 may include a plurality of input/output terminals 310. The input/output interface 300 is shown as a connector, but is not limited thereto. According to some example embodiments, the input/output terminals 310 of the input/output interface 300 may be solder balls or bumps.

Some of the wiring patterns 134 may electrically connect the input/output terminals 310 to the semiconductor chips 200, and some of the wiring patterns 134 may electrically connect the semiconductor chips 200 one another.

The input/output terminals 310 and the wiring patterns 134 may be electrically connected through first vias VA1 that penetrate through portions of the base substrate 100.

Although FIG. 1 shows an example in which the input/output terminals 310, the first memory semiconductor chips 220, and the at least one second memory semiconductor chip 230 are connected to the controller chip 210 through the wiring patterns 134, the inventive concept is not limited thereto. For example, some of the wiring patterns 134 may electrically connect the input/output terminals 310 to the first memory semiconductor chips 220, connect the input/output terminals 310 to the second memory semiconductor chip 230, or connect the first memory semiconductor chips 220 to the second memory semiconductor chip 230.

A pair of first open stubs ST1a, ST1b, and ST1c in FIGS. 2A to 4C and FIGS. 8 to 10 or a pair of second open stubs ST2a, ST2b, and ST2c in FIGS. 5A to 7A and FIGS. 11 to 13 may be connected to the wiring patterns 134 connected to at least one of the semiconductor chips 200. According to some example embodiments, the pair of first open stubs ST1a, ST1b, and ST1c or the pair of second open stubs ST2a, ST2b, and ST2c may be connected to the wiring patterns 134 connected to the controller chip 210. Detailed descriptions of the pair of first open stubs ST1a, ST1b, and ST1c and the pair of second open stubs ST2a, ST2b, and ST2c will be given below with reference to FIGS. 2A to 13.

Figure 2A:
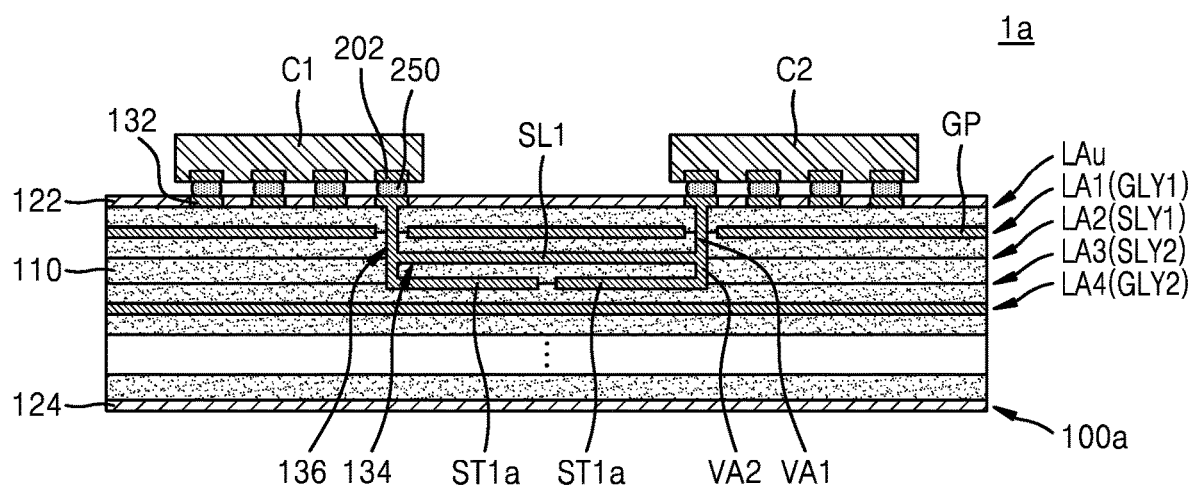
FIG. 2A is a cross-sectional view of a part of an electronic apparatus according to an example embodiment.
Figure 2B:
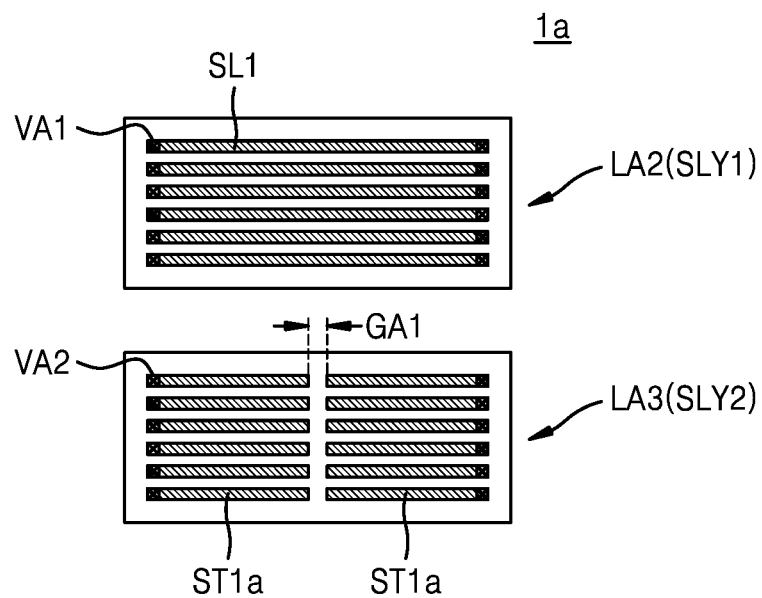
FIG. 2B is a layout view of main wiring patterns of a base substrate of the electronic apparatus according to an example embodiment.
Figure 2C:
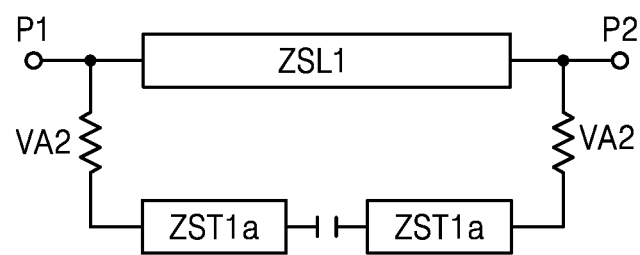
FIG. 2C is a schematic view of the main wiring patterns according to an example embodiment.

FIG. 2A is a cross-sectional view of a part of an electronic apparatus according to an example embodiment, FIG. 2B is a layout view of main wiring patterns of a base substrate of an electronic apparatus, and FIG. 2C is a schematic view of the main wiring patterns, according to example embodiments.

Referring to FIGS. 2A to 2C, an electronic apparatus 1a includes a base substrate 100a, and a first semiconductor chip C1 and a second semiconductor chip C2 attached to the base substrate 100a. Each of the first semiconductor chip C1 and the second semiconductor chip C2 may include a plurality of chip connecting pads 202. According to some example embodiments, each of the first semiconductor chip C1 and the second semiconductor chip C2 may be any one of the controller chip 210, the first memory semiconductor chip 220, and the second memory semiconductor chip 230 shown in FIG. 1.

According to some example embodiments, the base substrate 100a may be a printed circuit board. For example, the base substrate 100a may be a multi-layer printed circuit board. The base substrate 100a may include a substrate base 110 including at least one material selected from among phenol resin, epoxy resin, and polyimide. For example, the substrate base 110 may include at least one material selected from among Frame Retardant 4 (FR4), tetrafunctional epoxy, polyphenylene ether, epoxy/polyphenylene oxide, bismaleimide triazine (BT), thermount, cyanate ester, polyimide, and liquid crystal polymer, A top surface solder resist layer 122 and a bottom surface solder resist layer 124 covering at least portions of the substrate base 110 may be disposed in top and bottom surfaces of the base substrate 100a, respectively. A plurality of connecting pads 132, which are not covered by the top surface solder resist layer 122 and/or the bottom surface solder resist layer 124 and exposed, may be disposed in a top and/or bottom surface of the base substrate 100a. The connecting pads 132 may be electrically connected to the chip connecting pads 202 through chip connecting members 250. A chip connecting member 250 may be a solder ball or a bump, but is not limited thereto. For example, the chip connecting member 250 may be a bonding wire.

The base substrate 100a may be a multi-layer substrate in which the substrate base 110 includes a plurality of layers. The base substrate 100a may include the wiring patterns 134 between the layers of the substrate base 110. According to some example embodiments, the wiring patterns 134 may be disposed between the layers of the substrate base 110 and the top surface sold resist layer 122 and/or between the layers of the substrate base 110 and the bottom surface sold resist layer 124.

The term "wiring layer" refers to a place, in which an electric path extending 2-dimensionally may be formed, on or between top and bottom surfaces of the substrate base 110 of the base substrate 100a and each of the layers constituting the substrate base 110. Therefore, the base substrate 100a may have one more wiring layer than the number of layers constituting the substrate base 110.

Figure 7A:
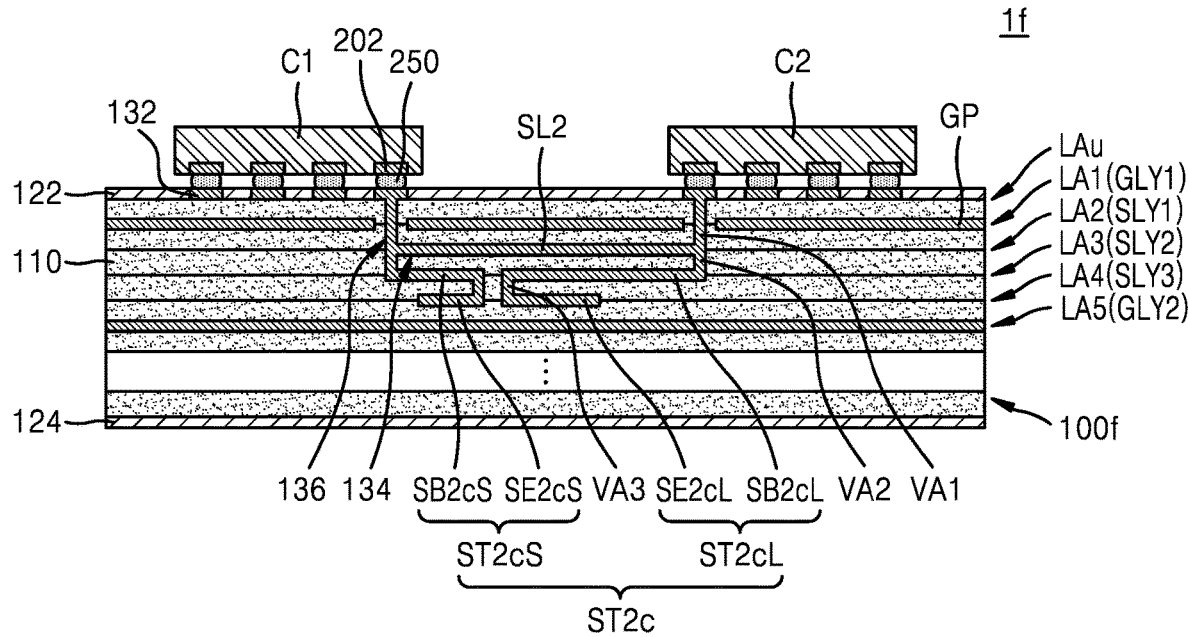
FIG. 7A is a cross-sectional view of a part of an electronic apparatus according to an example embodiment.

In this specification, a wiring layer in the top surface of the substrate base 110 may be referred to as a top surface wiring layer LAu, and wiring layers sequentially disposed from the top surface wiring layer LAu toward the bottom surface of the base substrate 100a may be referred to as first to fourth wiring layers LA1, LA2, LA3, and LA4, respectively. Also, as shown in FIG. 7A, at least one wiring layer including a fifth wiring layer LA5 may be further disposed under a fourth wiring layer LA4.

The connecting pads 132 may be disposed in the top surface wiring layer LAu. The wiring patterns 134 may be disposed in at least two of the first to fourth wiring layers LA1, LA2, LA3, and LA4.

According to some example embodiments, a ground plane layer GP may be disposed in at least one of the first to fourth wiring layers LA1, LA2, LA3, and LA4. A ground signal may be provided to the ground plane layer GP.

The base substrate 100a may further include a plurality of conductive vias 136 penetrating through at least a portion of the substrate base 110 to electrically connect the connecting pads 132 to the wiring patterns 134 or electrically connect the wiring patterns 134 in different wiring layers one another. Although not shown, some of the conductive vias 136 may be electrically connected to the ground plane layer GP. The conductive vias 136 may include a first via VA1 and a second via VA2.

The wiring patterns 134, the conductive vias 136, and/or the ground plane layer GP may include copper, nickel, stainless steel, or beryllium copper, not being limited thereto. The open stubs and the signal lines described herein may also include at least one conducive material such as copper, nickel, stainless steel, or beryllium copper, not being limited thereto.

Wiring layers in which the wiring patterns 134 are disposed may be referred to as signal first and second wiring layers SLY1 and SLY2, respectively, and layers in which ground plane layers GP are disposed may be referred to as first and second ground wiring layers GLY1 and GLY2, respectively. Although not shown, according to some example embodiments, in the first and second ground wiring layers GLY1 and GLY2, power plane layers to which power signals are provided may be disposed instead of ground plane layers GP to which ground signals are provided.

At least one first signal line SL1, which electrically connects the first semiconductor chip C1 to the second semiconductor chip C2, of the wiring patterns 134 may be disposed in a first signal wiring layer SLY1. According to some example embodiments, the first wiring layer LA1 and the second wiring layer LA2 sequentially located below the top surface wiring layer Lau, where the connecting pads 132 are disposed, may be the first ground wiring layer GLY1 in which the ground plane layer GP is disposed and the first signal wiring layer SLY1 in which the first signal line SL1 is disposed, respectively. In other words, the first ground wiring layer GLY1 may be disposed between the top surface wiring layer LAu and the first signal wiring layer SLY1. The ground plane layer GP in the first ground wiring layer GLY1 may prevent electromagnetic interference (EMI) originating from the outside of the base substrate 100a and/or the top surface wiring layer LAu to the first signal line SL1. According to some example embodiments, no ground wiring layer GLY1 may be disposed between the top surface wiring layer LAu and the first signal wiring layer SLY1.

At least one pair of the first open stubs ST1a of the wiring patterns 134 may be disposed below the first signal wiring layer SLY1 where the first signal line SL1 is disposed, that is, in a third wiring layer LA3. The pair of first open stubs ST1a may be apart from each other by a first interval GA1 in the third wiring layer LA3. The third wiring layer LA3 in which the pair of first open stubs ST1a are disposed may be referred to as a second signal wiring layer SLY2.

According to some example embodiments, the pair of first open stubs ST1a of the wiring patterns 134 may be disposed in the first signal wiring layer SLY1 (i.e., the second wiring layer LA2), and the first signal line SL1 may be disposed in the second signal wiring layer SLY2 (i.e., the third wiring layer LA3).

Both ends of the first signal line SL1 may be electrically connected to the connecting pads 132 via first vias VA1, and the pair of first open stubs ST1a may be electrically connected to the both ends of the first signal line SL1 through second vias VA2. The first vias VA1 may penetrate through portions of the substrate base 110 between the top surface wiring layer LAu and the first signal wiring layer SLY1, and the second vias VA2 may penetrate portions of the substrate base 110 between the first signal wiring layer SLY1 and the second signal wiring layer SLY2. The first vias VA1 and the second vias VA2 overlapping or connecting to each other in the vertical direction may be simultaneously formed to be integrated with each other, but the inventive concept is not limited thereto. According to some example embodiments, the first via VA1s and the second vias VA2 may be formed separately or may not be connected to each other.

According to some example embodiments, a wiring layer below the second signal wiring layer SLY2, that is, the fourth wiring layer LA4, may be a second ground wiring layer GLY2 where the ground plane layer GP is disposed.

Therefore, the first signal wiring layer SLY1, in which the first signal line SL1 is disposed, and the second signal wiring layer SLY2, in which the pair of first open stubs ST1a are disposed, may be disposed between the first ground wiring layer GLY1 and the second ground wiring layer GLY2 where the ground plane layer GP is disposed.

The pair of first open stubs ST1a may be arranged to completely overlap the first signal line SL1 in the vertical direction. For example, in a process for designing the wiring patterns 134 of the base substrate 100a, the pair of first open stubs ST1a may be formed by copying the first signal line SL1 of the first signal wiring layer SLY1, pasting it to the second signal wiring layer SLY2, and removing a portion the first signal line SL1 in the second signal wiring layer SLY2 to form the first interval GA1 in the pair of first open stubs ST1a. Therefore, the first signal line SL1 and the pair of first open stubs ST1a may be arranged to completely overlap each other in the vertical direction except for a portion the first signal line SL1 corresponding to the first interval GA1.

The sum of the extension lengths of the pair of first open stubs ST1a may be less than the extension length of the first signal line SL1 by the first interval GA1.

Each of the pair of first open stubs ST1a extends from one of a pair of second vias VA2 connected to both ends of the first signal line SL1 to face the other of the pair of the first open stubs ST1a, and may be apart from each other by the first interval GA1. In other words, a first end of each of the pair of first open stubs ST1a is connected to one of the second vias VA2, and a second end of one of the pair of first open stubs ST1a may face a second end of the other of the pair of first open stubs ST1a so that these two second ends may be opened without being connected to other electric paths.

The first signal line SL1 may transmit signals in both directions between the first semiconductor chip C1 and the second semiconductor chip C2. For example, the first signal line SL1 may be used for inputting/outputting data between the first semiconductor chip C1 and the second semiconductor chip C2. According to some example embodiments, the extension length of one of the pair of first open stubs ST1a may be identical to that of the other of the pair of first open stubs ST1a.

The extension length of the first signal line SL1 may be a physical length or an impedance ZSL1 between a first package terminal P1 and a second package terminal P2 that are disposed at both ends of the first signal line SL1 and connected to the first vias VA1. The extension length of one of the pair of first open stubs ST1a may be a physical length or an impedance ZST1a between the first end and the opened second end of the first open stub ST1a connected to one of the second vias VA2. The sum of the respective impedances ZST1a of the pair of first open stubs ST1a may be equal to or slightly less than the impedance ZSL1 of the first signal line SL1. The impedance of the second vias VA2 may be neglected, because it has a significantly small value as compared with the impedance ZSL1 of the first signal line SL1 or the impedance ZST1a of the first open stub ST1a.

When the pair of first open stubs ST1a connected to both ends of the first signal line SL1 is not present, and signals are exchanged via the first signal line SL1 between the first semiconductor chip C1 and the second semiconductor chip C2, signal distortion may occur due to capacitance of other wiring patterns 134 connected to the first semiconductor chip C1 or the second semiconductor chip C2, or due to signals reflected by the other wiring patterns 134. However, in the electronic apparatus 1a according to the present example embodiment, due to signals reflected from the second ends of the pair of first open stubs ST1a connected to both ends of the first signal line SL1, signal distortions of signals exchanged through the first signal line SL1 are compensated for and reduced. Therefore, the time margin characteristics are improved, and thus, high-speed operations may be performed.

Figure 3A:
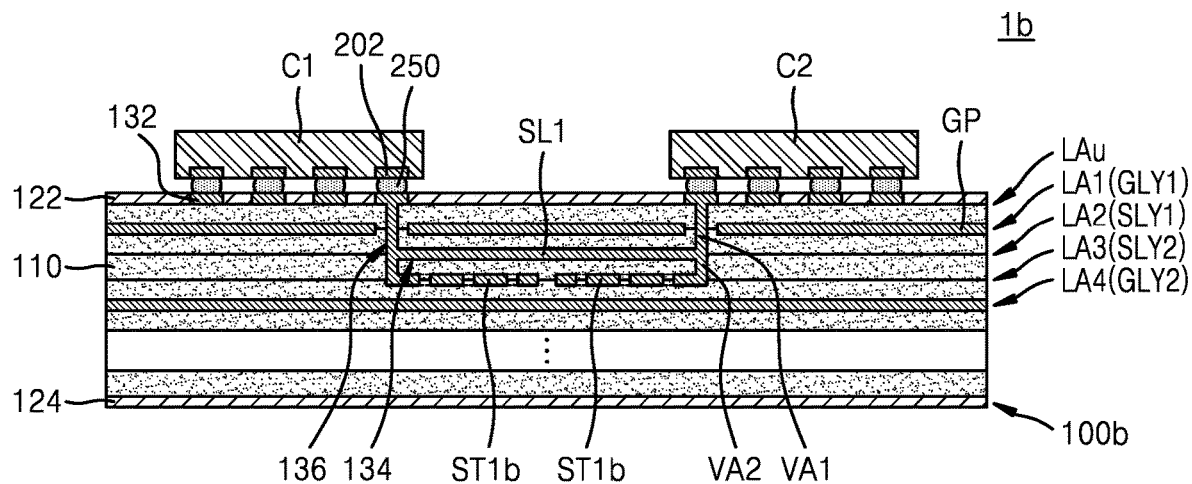
FIG. 3A is a cross-sectional view of a part of an electronic apparatus according to an example embodiment.
Figure 3B:
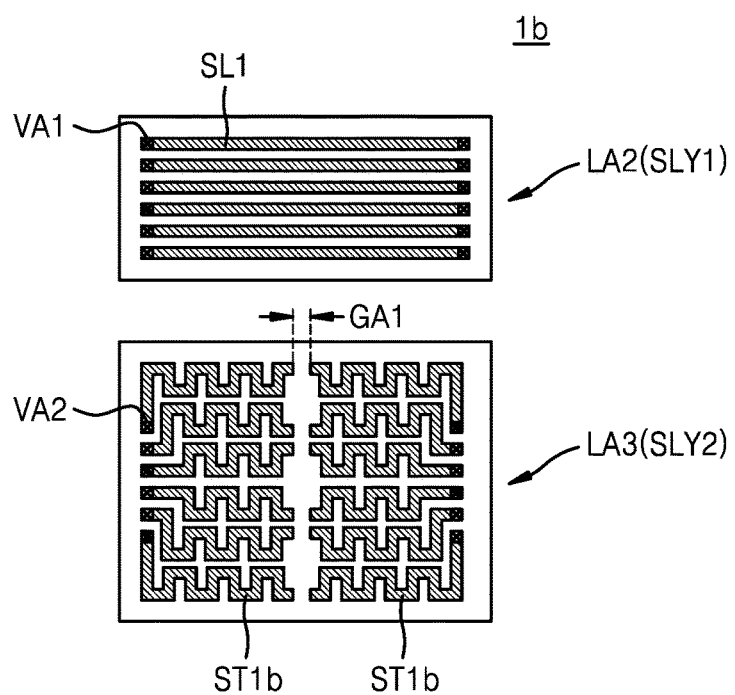
FIG. 3B is a layout view of main wiring patterns of a base substrate of the electronic apparatus according to an example embodiment.
Figure 3C:
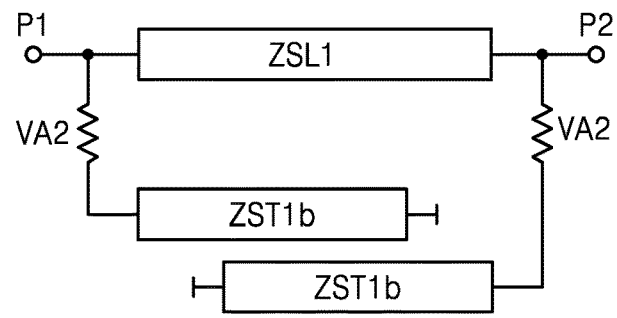
FIG. 3C is a schematic view of the main wiring patterns according to an example embodiment.

FIG. 3A is a cross-sectional view of a part of an electronic apparatus according to an example embodiment, FIG. 3B is a layout view of main wiring patterns of a base substrate of the electronic apparatus according to an example embodiment, and FIG. 3C is a schematic view of the main wiring patterns according to an example embodiment. Descriptions of FIGS. 3A to 3C that are identical to the descriptions given above with reference to FIGS. 2A to 2C may be omitted.

Referring to FIGS. 3A to 3C, an electronic apparatus 1b includes a base substrate 100b, and the first semiconductor chip C1 and the second semiconductor chip C2 mounted on the base substrate 100b.

The first signal line SL1, which electrically connects the first semiconductor chip C1 to the second semiconductor chip C2, of the wiring patterns 134 may be disposed in the first signal wiring layer SLY1.

At least one pair of the first open stubs ST1b of the wiring patterns 134 may be disposed below the second signal wiring layer SLY2 where the first signal line SL1 is disposed. The pair of first open stubs ST1b may be apart from each other by a first interval GA1 in the third wiring layer LA3.

The pair of first open stubs ST1b may be bent or may take a convex and/or concave form, and extends in the second signal wiring layer SLY2. The sum of the extension lengths of the pair of first open stubs ST1b may be greater than the extension length of the first signal line SL1. According to some example embodiments, the sum of the extension lengths of the pair of first open stubs ST1b may be greater than the extension length of the first signal line SL1 and less than or equal to twice the extension length of the first signal line SL1.

Each of the pair of first open stubs ST1b is bent or takes a convex and/or concave form, extends from one of a pair of second vias VA2 connected to both ends of the first signal line SL1, and may be apart from each other by the first interval GA1. In other words, a first end of each of the pair of first open stubs ST1b is connected to one of the second vias VA2, and a second end of one of the pair of first open stubs ST1b may face a second end of the other of the pair of first open stubs ST1a so that these two second ends may be opened without being connected to other electric paths.

According to some example embodiments, the extension length of one of the pair of first open stubs ST1b may be identical to that of the other of the pair of first open stubs ST1b.

The extension length of the first signal line SL1 may be a physical length or an impedance ZSL1 between a first package terminal P1 and a second package terminal P2 that are disposed at both ends of the first signal line SL1 and connected to the first vias VA1. The extension length of one of the first open stubs ST1b may be a physical length or an impedance ZST1b between the first end and the opened second end of the first open stub ST1b connected to one of the second vias VA2. The sum of the respective impedances ZST1b of the pair of first open stubs ST1b may be greater than the impedance ZSL1 of the first signal line SL1 and less than or equal to twice the impedance ZSL1 of the first signal line SL1.

Figure 4A:
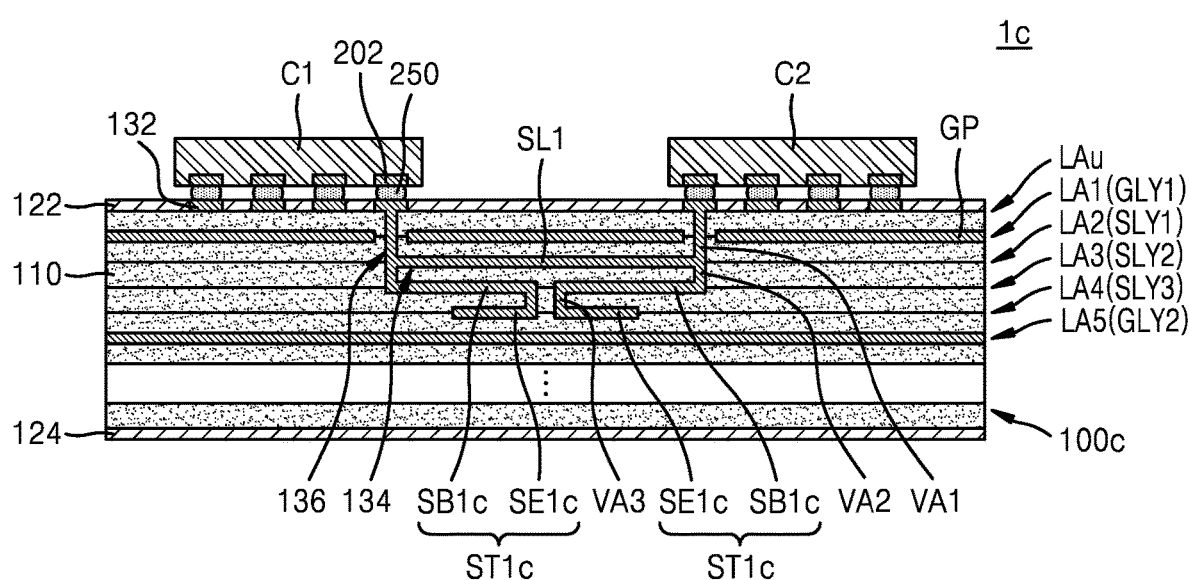
FIG. 4A is a cross-sectional view of a part of an electronic apparatus according to an example embodiment.
Figure 4B:
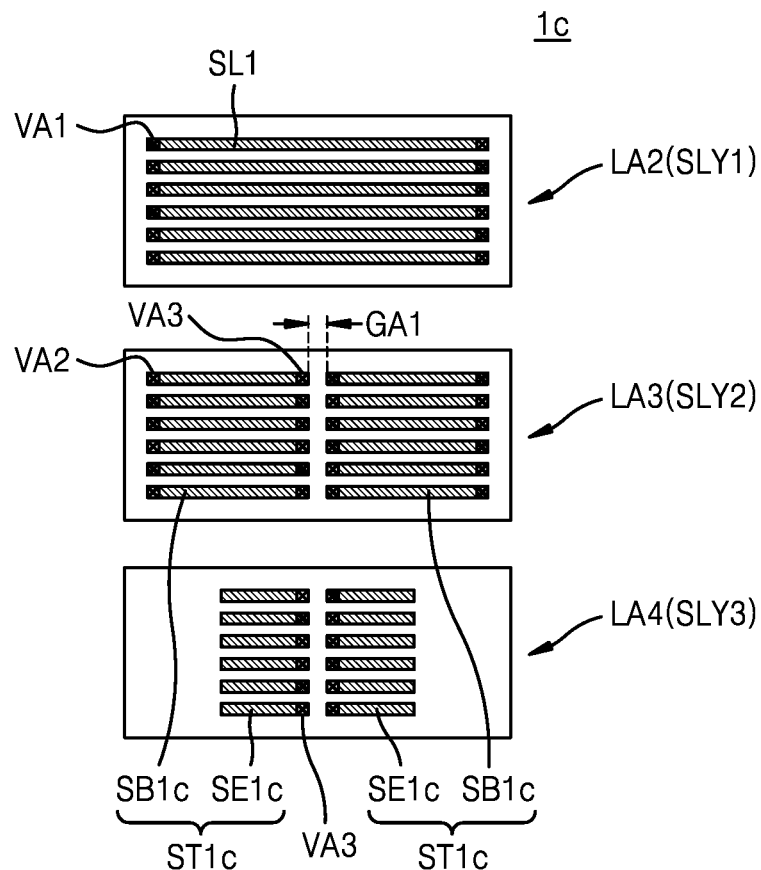
FIG. 4B is a layout view of main wiring patterns of a base substrate of the electronic apparatus according to an example embodiment.
Figure 4C:
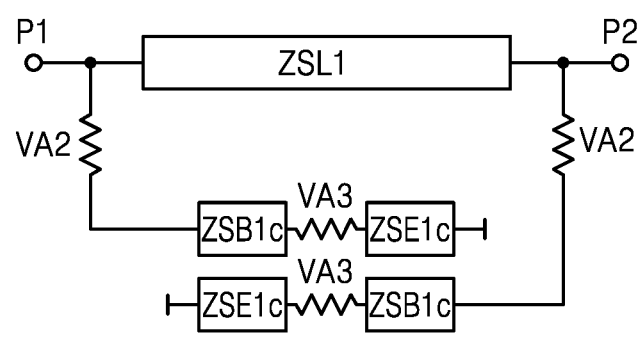
FIG. 4C is a schematic view of the main wiring patterns according to an example embodiment.

FIG. 4A is a cross-sectional view of a part of an electronic apparatus according to an example embodiment, FIG. 4B is a layout view of main wiring patterns of a base substrate of the electronic apparatus according to an example embodiment, and FIG. 4C is a schematic view of the main wiring patterns according to an example embodiment. Descriptions of FIGS. 4A to 4C that are identical to the descriptions given above with reference to FIGS. 2A to 3C may be omitted.

Referring to FIGS. 4A to 4C, an electronic apparatus 1c includes a base substrate 100c, and the first semiconductor chip C1 and the second semiconductor chip C2 mounted on the base substrate 100c. The conductive via 136 may include the first vias VA1, the second vias VA2, and third vias VA3.

The first signal line SL1, which electrically connects the first semiconductor chip C1 to the second semiconductor chip C2, of the wiring patterns 134 may be disposed in the first signal wiring layer SLY1.

At least one pair of first open stubs ST1c of the wiring patterns 134 may be disposed below the first signal wiring layer SLY1 where the first signal line SL1 is disposed, that is, in the third wiring layer LA3 and the fourth wiring layer LA4 that are disposed below the second wiring layer LA2. The third wiring layer LA3 and the fourth wiring layer LA4 may be the second signal wiring layer SLY2 and a third signal wiring layer SLY3, respectively.

Each of the pair of first open stubs ST1c may include a first base stub SB1c in the second signal wiring layer SLY2 and a first extended stub SE1c connected to the first base stub SB1c through one of the third vias VA3 and disposed in the third signal wiring layer SLY3. The third vias VA3 may penetrate between the second signal wiring layer SLY2 and the third signal wiring layer SLY3.

A first end of the first base stub SB1c of each of the pair of first open stubs ST1c may be connected to one of the second vias VA2, and a second end of the first base stub SB1c may face a second end of the other first base stub SB1c and be connected to one of the third vias VA3.

The first extended stub SE1c of each of the pair of first open stubs ST1c may include a first end, facing a first end of the other first extended stub SE1c and be connected to one of the third vias VA3, and a second end that extends away from the other first extended stub SE1c and is opened without being connected to other electric paths.

Second ends of the first base stubs SB1c of the pair of first open stubs ST1c may be apart from each other by the first interval GA1 in the second signal wiring layer SLY2, and first ends of the first extended stubs SE1c may be apart from each other the first interval GA1 in the third signal wiring layer SLY3.

The pair of first open stubs ST1c may be arranged to completely overlap the first signal line SL1 in the vertical direction. In other words, both the first base stub SB1c and the first extended stub SE1c of each of the pair of first open stubs ST1c may be arranged to complete overlap the first signal line SL1 in the vertical direction.

The sum of the extension lengths of the pair of first open stubs ST1c may be greater than the extension length of the first signal line SL1. According to some example embodiments, the sum of the extension lengths of the pair of first open stubs ST1c may be greater than the extension length of the first signal line SL1 and equal to or greater than twice the extension length of the first signal line SL1.

According to some example embodiments, the extension length of one of the pair of first open stubs ST1c may be identical to that of the other of the pair of first open stubs ST1c.

The extension length of the first signal line SL1 may be a physical length or an impedance ZSL1 between a first package terminal P1 and a second package terminal P2 that are disposed at both ends of the first signal line SL1 and connected to the first vias VA1. The extension length of the first open stub ST1c may be a sum of a physical length or an impedance ZSB1c between the first end of the first base stub SB1c connected to one of the second via VA2s and the second end of the first base stub SB1c connected to one of the third via VA3s and a physical length or an impedance ZSE1c between the first end of the first extended stub SE1c connected to the third via VA3 and the opened second end of the first extended stub SE1c.

The sum of the impedance ZSB1c of the first base stubs SB1c of the pair of first open stubs ST1c and the impedance ZSE1c of the first extended stub SE1cs of the pair of first open stubs ST1c may be greater than the impedance ZSL1 of the first signal line SL1 and may be equal to or greater than twice the impedance ZSL1 of the first signal line SL1.

The impedance of the second via VA2 and the impedance of the third via VA3 may be neglected, because the impedance of the second via VA2 and the impedance of the third via VA3 may have values significantly less than the impedance ZSL1 of the first signal line SL1, the impedance ZSB1c of the first base stub SB1c, or the impedance ZSE1c of the first extended stub SE1c.

Figure 5A:
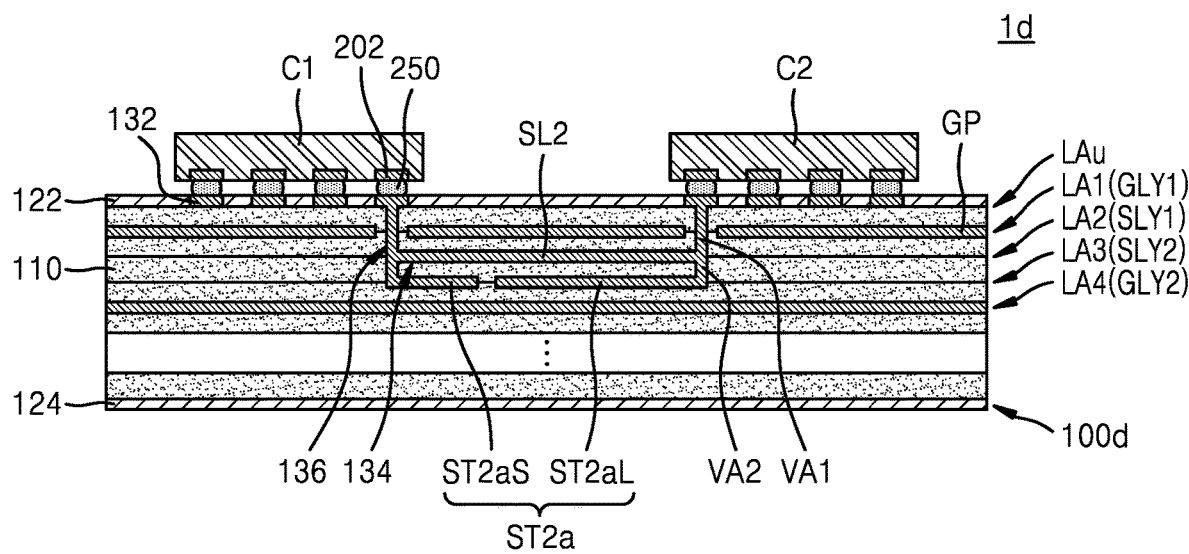
FIG. 5A is a cross-sectional view of a part of an electronic apparatus according to an example embodiment.
Figure 5B:
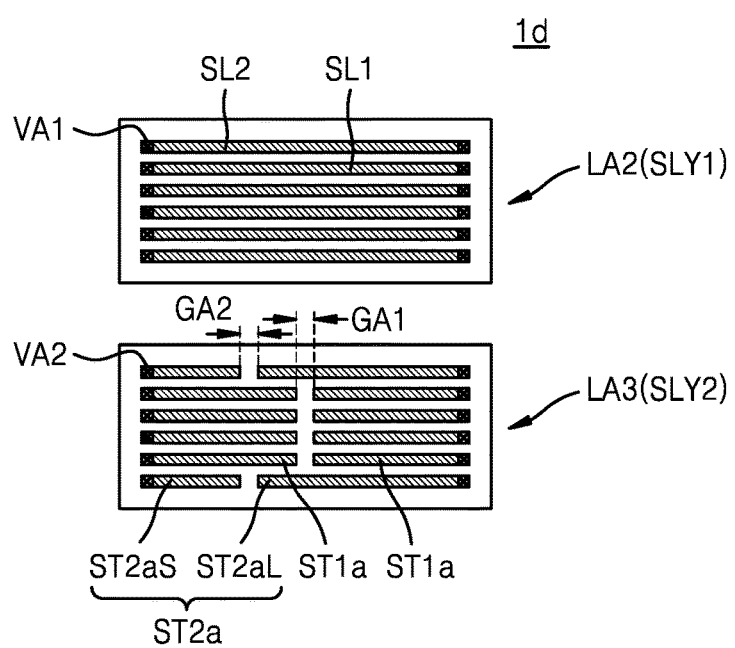
FIG. 5B is a layout view of main wiring patterns of a base substrate of the electronic apparatus according to an example embodiment.
Figure 5C:
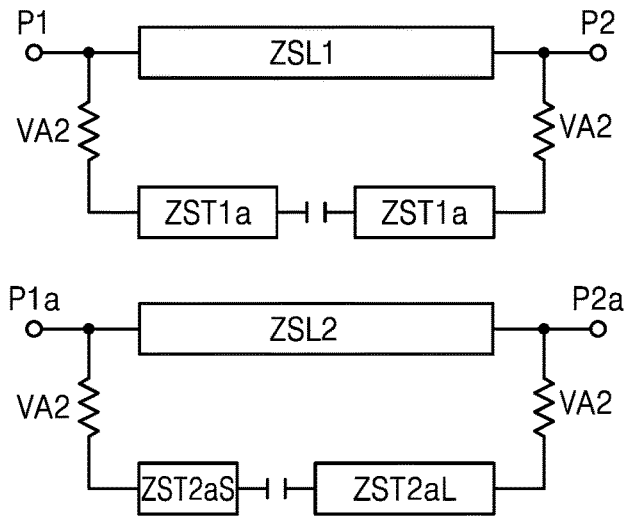
FIG. 5C is a schematic view of the main wiring patterns according to an example embodiment.

FIG. 5A is a cross-sectional view of a part of an electronic apparatus according to an example embodiment, FIG. 5B is a layout view of main wiring patterns of a base substrate of the electronic apparatus according to an example embodiment, and FIG. 5C is a schematic view of the main wiring patterns according to an example embodiment. Descriptions of FIGS. 5A to 5C that are identical to the descriptions given above with reference to FIGS. 2A to 4C may be omitted.

Referring to FIGS. 5A to 5C, an electronic apparatus 1d includes a base substrate 100d, and the first semiconductor chip C1 and the second semiconductor chip C2 mounted on the base substrate 100d.

The first signal line SL1 and a second signal line SL2, which electrically connect the first semiconductor chip C1 to the second semiconductor chip C2, of the wiring patterns 134 may be disposed in the first signal wiring layer SLY1.

The at least one pair of first open stubs ST1a and at least one pair of second open stubs ST2a of the wiring patterns 134 may be disposed below the first signal wiring layer SLY1 where the second signal line SL2 is disposed, that is, in the third wiring layer LA3. The pair of second open stubs ST2a may be apart from each other a second interval GA2 in the third wiring layer LA3. The second interval GA2 and the first interval GA1 may have a same value. However, the inventive concept is not limited thereto, and the second interval GA2 and the first interval GA1 may have different values.

Both ends of the second signal line SL2 may be electrically connected to the connecting pads 132 via the first vias VA1, and the pair of second open stubs ST2a may be electrically connected to both ends of the second signal line SL2 via the second vias VA2.

The pair of second open stubs ST2a may be arranged to completely overlap the second signal line SL2 in the vertical direction. Therefore, the second signal line SL2 and the pair of second open stubs ST2a may be arranged to completely overlap each other in the vertical direction except for a portion the second signal line SL2 corresponding to the second interval GA2.

The sum of the extension lengths of the pair of second open stubs ST2a may be less than the extension length of the second signal line SL2 by the second interval GA2.

Each of the pair of second open stubs ST2a extends from one of a pair of second vias VA2 connected to both ends of the second signal line SL2 to face the other of the pair of the second open stubs ST2a, and may be apart from each other by the second interval GA2. In other words, a first end of each of the pair of second open stubs ST2a is connected to one of the second vias VA2, and a second end of the pair of second open stubs ST2a may face a second end of the other of the pair of second open stubs ST2a so that these two seconds ends may be opened without being connected to other electric paths.

The second signal line SL2 may transmit signals in one direction between the first semiconductor chip C1 and the second semiconductor chip C2. For example, the second signal line SL2 may be used to provide a clock, a command, an address input, a chip selection, a power supply, and a ground supply from the first semiconductor chip C1 to the second semiconductor chip C2. The pair of second open stubs ST2a may include a second long open stub ST2aL and a second short open stub ST2aS having different extension lengths. The extension length of the second long open stub ST2aL may be longer than the extension length of the second short open stub ST2aS.

According to some example embodiments, when the first semiconductor chip C1 is a controller chip (210 in FIG. 1) and the second semiconductor chip C2 is a first memory semiconductor chip (220 in FIG. 1) or a second memory semiconductor chip (230 in FIG. 1), the second short open stub ST2aS may be connected to a first end of the second signal line SL2 connected to the first semiconductor chip C1 and the second long open stub ST2aL may be connected to a second end of second signal line SL2 connected to the second semiconductor chip C2.

The extension length of one of the pair of first open stubs ST1a is the same as that of the other of the pair of first open stubs ST1a, and the extension length of the second long open stub ST2aL and the extension length of the second short stub ST2aS, are different from each other. Therefore, a ratio of the extension lengths of the two first open stubs ST1a, that is, a ratio of the extension length of one first open stub ST1a included in the pair of first open stubs ST1a to the extension length of the other first open stub ST1a, may be different from a ratio of the extension lengths of the two second open stubs ST2a, that is, a ratio of the extension length of one second open stub ST2a included in the pair of second open stubs ST2a to the extension length of the other second open stub ST2a. For example, the ratio of the extension lengths of the two second open stubs ST2a may be greater than the ratio of the extension lengths of the pair of first open stubs ST1a.

The extension length of the second signal line SL2 may be a physical length or an impedance ZSL2 between a first package terminal P1a and a second package terminal P2a that are disposed at both ends of the second signal line SL2 and connected to the first vias VA1. The extension length of the second long open stub ST2aL may be a physical length or an impedance ZST2aL between a first end of the second long open stub ST2aL connected to one of the second vias VA2 and a second end of the second long open stub ST2aL that is opened, and the extension length of the second short open stub ST2aS may be a physical length or an impedance ZST2aS between a first end of the second short open stub ST2aS connected to one of the second vias VA2 and a second end of the second short open stub ST2aS that is opened. The sum of the impedance ZST2aL of the second long open stub ST2aL and the impedance ZST2aS of the second short open stub ST2aS may be equal to or slightly less than the impedance ZSL2 of the second signal line SL2. According to some example embodiments, the sum of the impedances ZST1a of the pair of first open stubs ST1a may be substantially identical to the sum of the impedance ZST2aL of the second long open stub ST2aL and the impedance ZST2aS of the second short open stub ST2aS.

In the electronic apparatus 1d according to an example embodiment, since the pair of first open stubs ST1a connected to both ends of the first signal line SL1 for transmitting signals in both directions and the pair of second open stubs ST2a connected to both ends of the second signal line SL2 for transmitting signals in one direction compensate for and reduce signal distortions of signals exchanged between the first semiconductor chip C1 and the second semiconductor chip C2 through the first signal line SL1 and the second signal line SL2, high-speed operation may be performed.

Figure 6A:
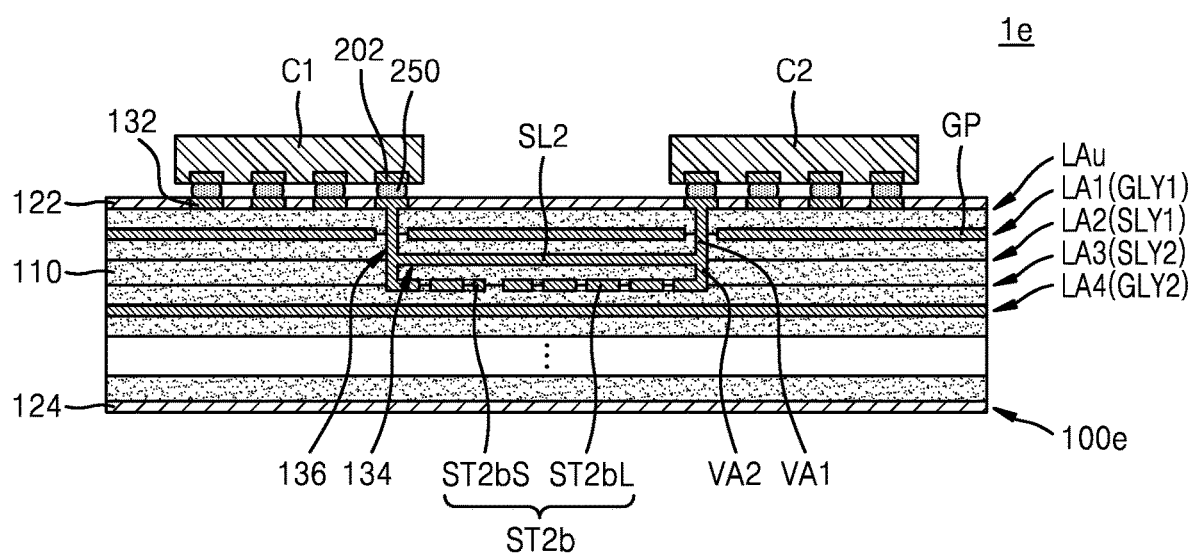
FIG. 6A is a cross-sectional view of a part of an electronic apparatus according to an example embodiment.
Figure 6B:
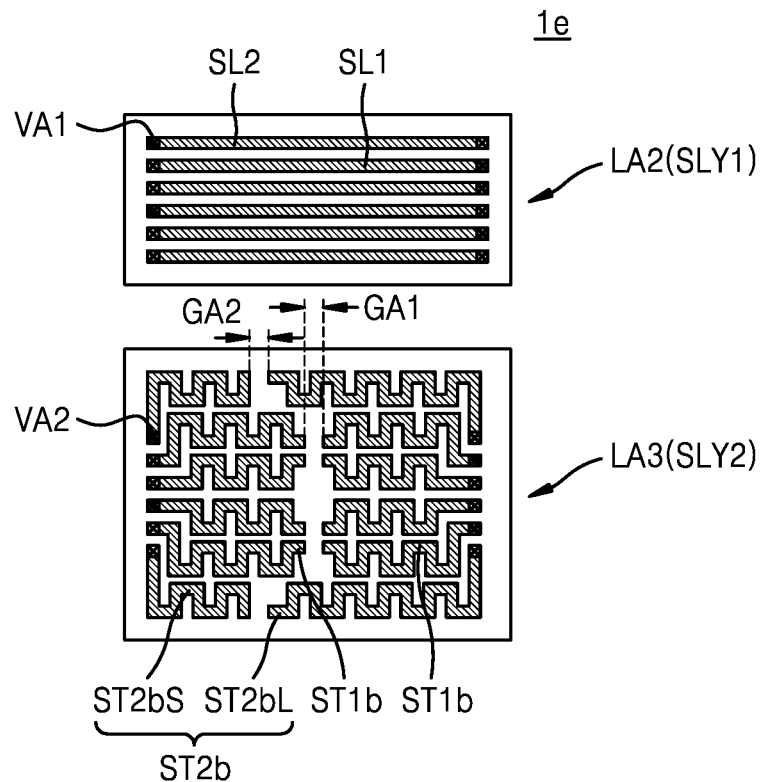
FIG. 6B is a layout view of main wiring patterns of a base substrate of the electronic apparatus according to an example embodiment.
Figure 6C:
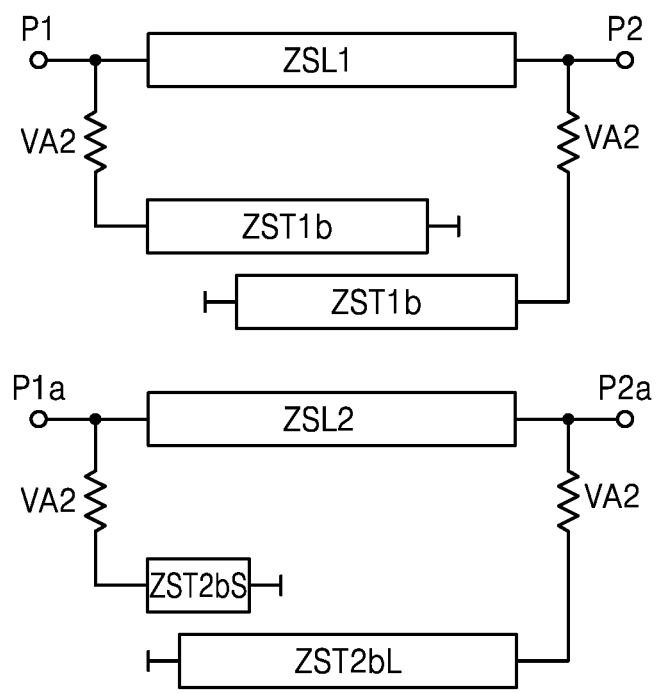
FIG. 6C is a schematic view of the main wiring patterns according to an example embodiment.

FIG. 6A is a cross-sectional view of a part of an electronic apparatus according to an example embodiment, FIG. 6B is a layout view of main wiring patterns of a base substrate of the electronic apparatus according to an example embodiment, and FIG. 6C is a schematic view of the main wiring patterns according to an example embodiment. Descriptions of FIGS. 6A to 6C that are identical to the descriptions given above with reference to FIGS. 3A to 3C and FIGS. 5A to 5C may be omitted.

Referring to FIGS. 6A to 6C, an electronic apparatus 1e includes a base substrate 100e, and the first semiconductor chip C1 and the second semiconductor chip C2 mounted on the base substrate 100e.

The first signal line SL1 and a second signal line SL2, which electrically connect the first semiconductor chip C1 to the second semiconductor chip C2, of the wiring patterns 134 may be disposed in the first signal wiring layer SLY1.

The at least one pair of first open stubs ST1b and at least one pair of second open stubs ST2b of the wiring patterns 134 may be disposed below the first signal wiring layer SLY1 where the second signal line SL2 is disposed, that is, in the third wiring layer LA3. The pair of second open stubs ST2b may be from each other by the second interval GA2 apart in the third wiring layer LA3. The pair of second open stubs ST2b may be electrically connected to the second signal line SL2 via the second vias VA2.

The pair of second open stubs ST2b may be bent or may take a convex and/or concave form, and extends in the second signal wiring layer SLY2. The sum of the extension lengths of the pair of second open stubs ST2b may be greater than the extension length of the second signal line SL2. According to some example embodiments, the sum of the extension lengths of the pair of second open stubs ST2b may be greater than the extension length of the second signal line SL2 and equal to or greater than twice the extension length of the second signal line SL2.

Each of the pair of second open stubs ST2b is bent or takes a convex and/or concave form, extends from one of a pair of second vias VA2 connected to both ends of the second signal line SL2, and may be apart from each other by the second interval GA2. In other words, a first end of each of the pair of second open stubs ST2b is connected to one of the second vias VA2, and a second end of one of the pair of second open stubs ST2b may face a second end of the other of the pair of second open stub ST2b so that these two second ends may be opened without being connected to other electric paths. The pair of second open stubs ST2b may include a second long open stub ST2bL and a second short open stub ST2bS having different extension lengths. The extension length of the second long open stub ST2bL may be longer than the extension length of the second short open stub ST2bS.

The extension length of the second signal line SL2 may be a physical length or an impedance ZSL2 between a first package terminal P1a and a second package terminal P2a that are disposed at both ends of the second signal line SL2 and connected to the first vias VA1. The extension length of the second long open stub ST2bL may be a physical length or an impedance ZST2bL between a first end of the second long open stub ST2bL connected to one of the second via VA2s and a second end of the second long open stub ST2bL that is opened, and the extension length of the second short open stub ST2bS may be a physical length or an impedance ZST2bS between a first end of the second short open stub ST2bS connected to one of the second vias VA2 and a second end of the second short open stub ST2bS that is opened. The sum of the impedance ZST2bL of the second long open stub ST2bL and the impedance ZST2bS of the second short open stub ST2bS may be greater than the impedance ZSL2 of the second signal line SL2 and may be equal to or greater than twice the impedance ZSL2 of the second signal line SL2.

Figure 7B:
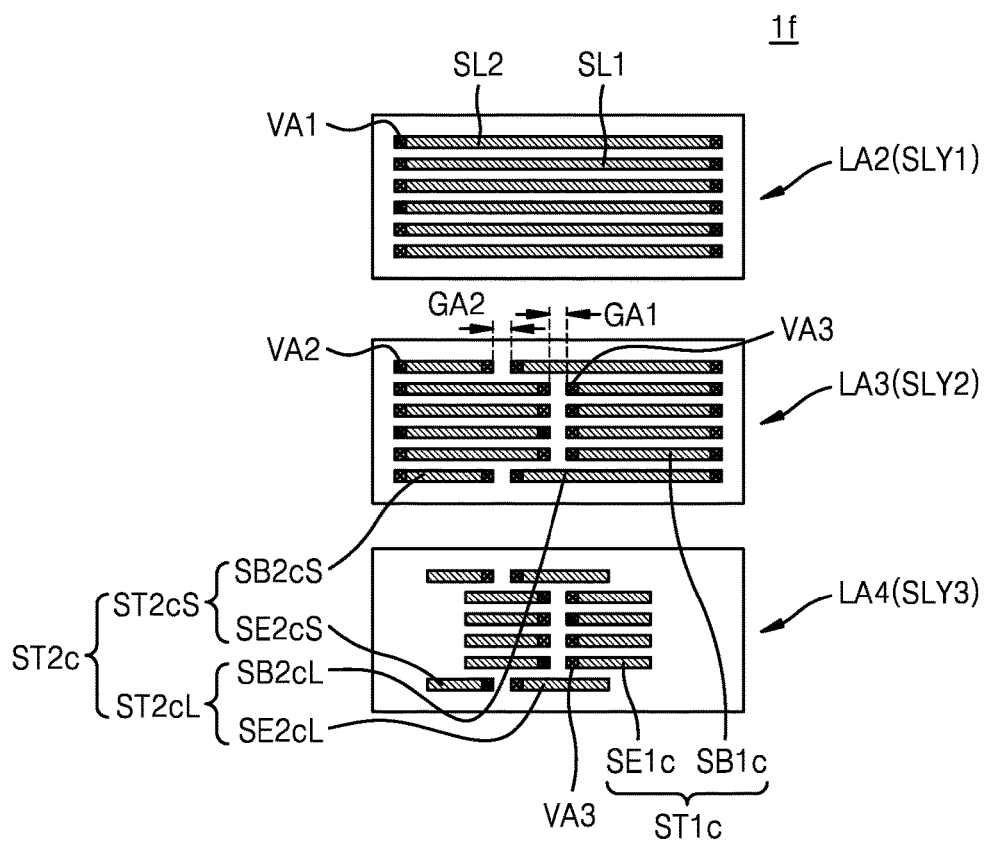
FIG. 7B is a layout view of main wiring patterns of a base substrate of the electronic apparatus according to an example embodiment.
Figure 7C:
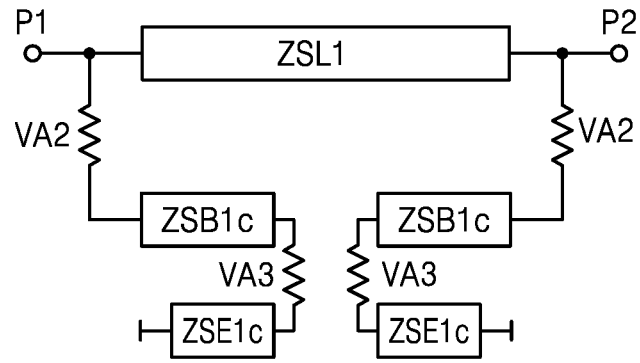
FIG. 7C is a schematic view of the main wiring patterns according to an example embodiment.
Figure 7C:
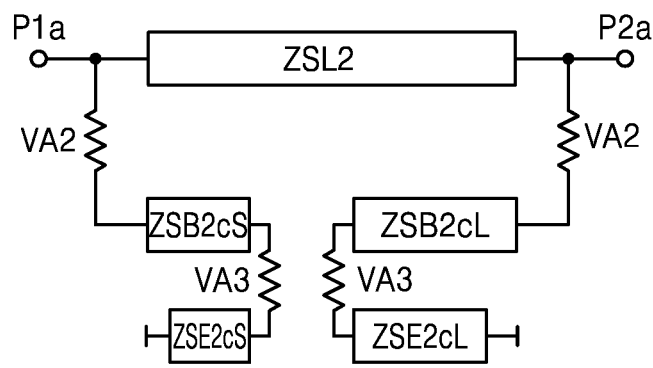

FIG. 7A is a cross-sectional view of a part of an electronic apparatus according to an example embodiment, FIG. 7B is a layout view of main wiring patterns of a base substrate of the electronic apparatus according to an example embodiment, and FIG. 7C is a schematic view of the main wiring patterns according to an example embodiment. Descriptions of FIGS. 7A to 7C that are identical to the descriptions given above with reference to FIGS. 4A to 5C may be omitted.

Referring to FIGS. 7A to 7C, an electronic apparatus $1f$ includes a base substrate $100f$, and a first semiconductor chip C1 and a second semiconductor chip C2 mounted on the base substrate $100f$.

The first signal line SL1 and a second signal line SL2, which electrically connect the first semiconductor chip C1 to the second semiconductor chip C2, of the wiring patterns 134 may be disposed in the first signal wiring layer SLY1.

The at least one pair of first open stubs ST1$c$ and a pair of second open stubs ST2$c$ of the wiring patterns 134 may be disposed below the first signal wiring layer SLY1 where the second signal line SL2 is disposed, that is, in the third wiring layer LA3 and the fourth wiring layer LA4.

The pair of second open stubs ST2$c$ may include a second long open stub ST2$c$L and a second short open stub ST2$c$S having different extension lengths. The extension length of the second long open stub ST2$c$L may be longer than the extension length of the second short open stub ST2$c$S.

The second long open stub ST2$c$L may include a second long base stub SB2$c$L disposed in the second signal wiring layer SLY2 and a second long extended stub SE2$c$L connected to the second long base stub SB2$c$L through one the third vias VA3 and disposed in the third signal wiring layer SLY3. The second short open stub ST2$c$S may include a second short base stub SB2$c$S disposed in the second signal wiring layer SLY2 and a second short extended stub SE2$c$S connected to the second short base stub SB2$c$S through one of the third vias VA3 and disposed in the third signal wiring layer SLY3.

A second end of the second long base stub SB2$c$L and a second end of the second short base stub SB2$c$S may be apart from each other by the second interval GA2 in the second signal wiring layer SLY2, and a first end of the second long extended stub SE2$c$L and a first end of the second short extended stub SE2$c$S may be apart from each other by the first interval GA2 in the third signal wiring layer SLY3.

The second long extended stub SE2$c$L may include the first end, facing the first end of the second short extended stub SE2$c$S and connected to one of the third via VA3$s$, and the second end extending away from the second short extended stub SE2$c$S and not connected to other electric paths. The second short extended stub SE2$c$S may include the first end, facing the first end of the second long extended stub SE2$c$L and connected to one of the third vias VA3, and the second end extending away from the second long extended stub SE2$c$L and not connected to other electric paths.

The second long open stub ST2$c$L and the second short open stub ST2$c$S may be arranged to completely overlap the second signal line SL2 in the vertical direction.

The extension length of the second signal line SL2 may be a physical length or an impedance ZSL2 between a first package terminal P1$a$ and a second package terminal P2$a$ that disposed at both ends of the second signal line SL2 and connected to the first vias VA1. The extension length of the second long open stub ST2$c$L may be the sum of a physical length or an impedance ZBS2$c$L between the first end of the second long open stub ST2$c$L connected to one of the second vias VA2 and the second end of the second long open stub ST2$c$L connected to one of the third via VA3$s$ and a physical length or an impedance ZSE2$c$L between the first end of the second long extended stub SE2$c$L connected to the one of the third vias VA3 and the opened second end second short extended stub SE2$c$S. The extension length of the second short open stub ST2$c$S may be the sum of a physical length or an impedance ZBS2$c$S between the first end of the second short open stub ST2$c$S connected to one of the second vias VA2 and the second end of the second short open stub ST2$c$S connected to one of the third vias VA3 and a physical length or an impedance ZSE2$c$L between the first end of the second short extended stub SE2$c$S connected to the one of the third vias VA3 and the opened second end of the second short extended stub SE2$c$S.

The sum of the impedance ZSB2$c$L+ZSE2$c$L of the second long open stub ST2$b$L and the impedance ZST2$b$S of the second short open stub ST2$b$S may be greater than the impedance ZSL2 of the second signal line SL2, and may be equal to or greater than twice the impedance ZSL2 of the second signal line SL2.

FIGS. 8 to 13 are cross-sectional views of portions of electronic apparatuses according to example embodiments. Descriptions of FIGS. 8 to 13 that are identical to the descriptions given above with reference to FIGS. 1 to 7C may be omitted.

Figure 8:
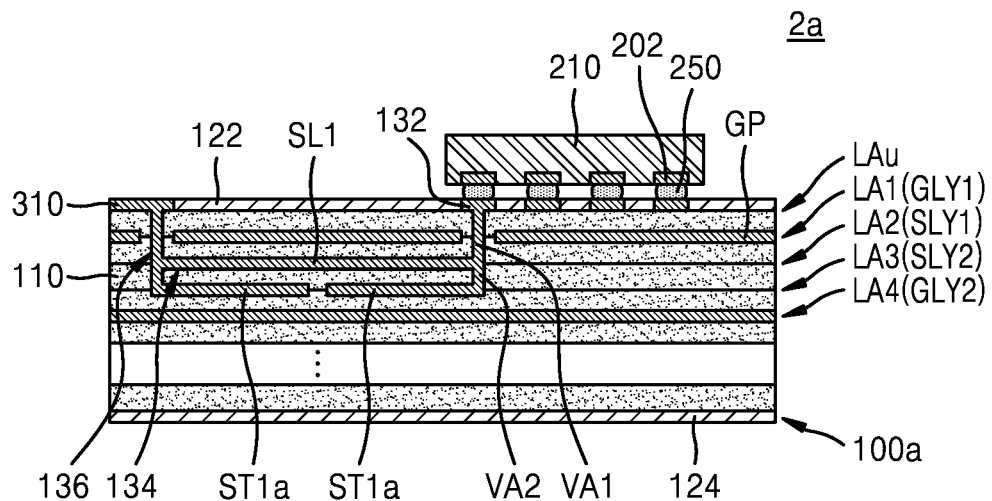
FIGS. 8 to 13 are cross-sectional views of portions of electronic apparatuses according to example embodiments.

Referring to FIG. 8, an electronic apparatus 2$a$ includes the base substrate 100$a$, the controller chip 210 mounted on the base substrate 100$a$, and the input/output terminal 310. The electronic apparatus 2$a$ shown in FIG. 8 is mostly similar to the electronic apparatus 1$a$ shown in FIGS. 2A to 2C except that the pair of first open stubs ST1$a$ are connected to the first signal line SL1, which connects the input/output terminal 310 to the controller chip 210, through the second vias VA2. Therefore, detailed descriptions thereof will be omitted. Here, however, the input/output terminal 310 may be used as a connection pad like the connection pads 132 of the electronic apparatus 1$a$ shown in FIGS. 2A to 2C or a terminal 312 of a memory slot 302 to be described later in referent to FIG. 18.

In the electronic apparatus 2$a$ according to an example embodiment, since signal distortions of signals exchanged through the first signal line SL1 between the input/output terminal 310 and the controller chip 210 are compensated for and reduced by signals reflected from the second ends of the pair of first open stubs ST1$a$ connected to both ends of the first signal line SL1, the time margin characteristic may be improved, and thus, high-speed operation may be performed.

Figure 9:
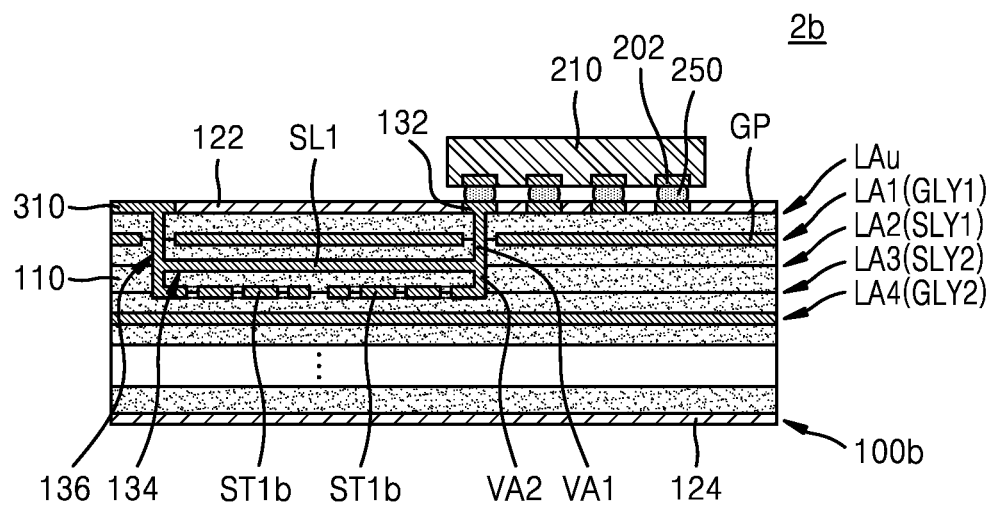

Referring to FIG. 9, an electronic apparatus 2$b$ includes the base substrate 100$b$, the controller chip 210 mounted on the base substrate 100$b$, and the input/output terminal 310. The electronic apparatus 2$b$ shown in FIG. 9 is mostly similar to the electronic apparatus 1$b$ shown in FIGS. 3A to 3C except that the pair of first open stubs ST1$b$ are connected to the first signal line SL1, which connects the input/output terminal 310 to the controller chip 210, through the second vias VA2. Therefore, detailed descriptions thereof will be omitted.

Figure 10:
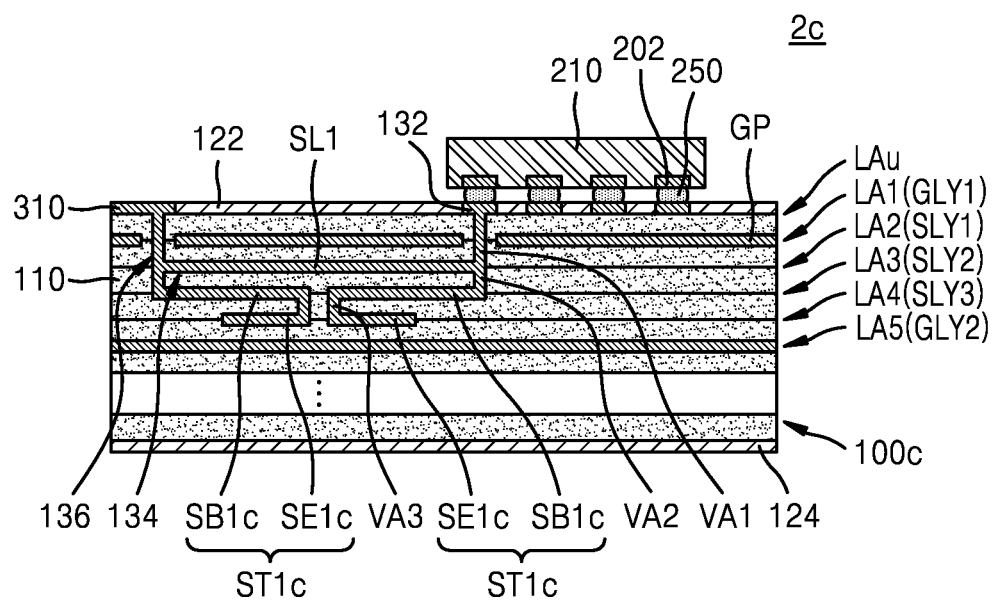

Referring to FIG. 10, an electronic apparatus 2$c$ includes the base substrate 100$c$, the controller chip 210 mounted on the base substrate 100$c$, and the input/output terminal 310. The electronic apparatus 2$c$ shown in FIG. 10 is mostly similar to the electronic apparatus 1$c$ shown in FIGS. 4A to 4C except that the pair of first open stubs ST1c are connected to the first signal line SL1, which connects the input/output terminal 310 to the controller chip 210, through the second vias VA2. Therefore, detailed descriptions thereof will be omitted.

Figure 11:
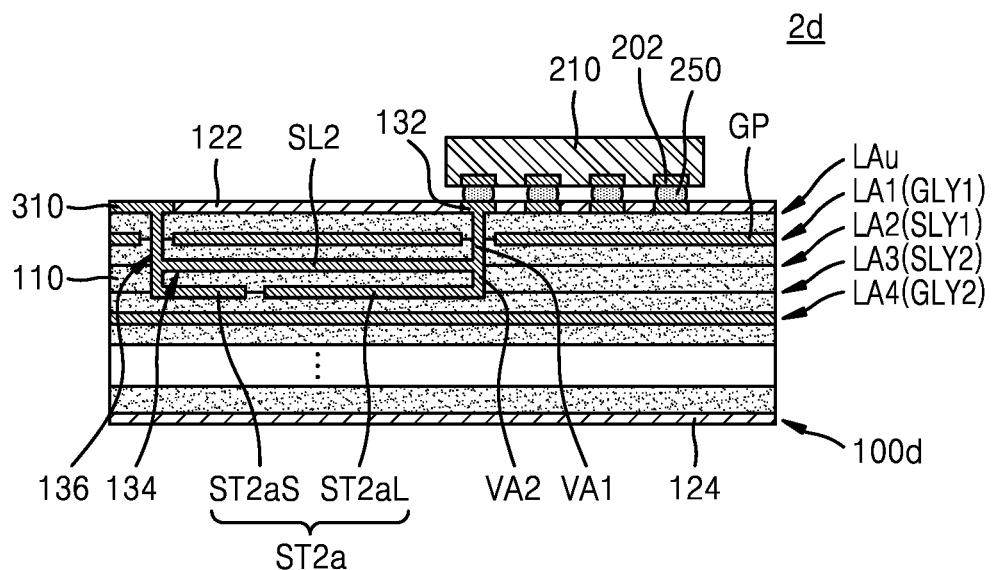

Referring to FIG. 11, an electronic apparatus 2d includes the base substrate 100d, the controller chip 210 mounted on the base substrate 100d, and the input/output terminal 310. The electronic apparatus 2d shown in FIG. 11 is mostly similar to the electronic apparatus 1d shown in FIGS. 5A to 5C except that the pair of second open stubs ST2a are connected to the second signal line SL2, which connects the input/output terminal 310 to the controller chip 210, through the second vias VA2. Therefore, detailed descriptions thereof will be omitted.

In the electronic apparatus 2d according to an example embodiment, since the pair of second open stubs ST2a connected to both ends of the second signal line SL2 for transmitting signals in one direction from the input/output terminal 310 to the controller chip 210 compensate for and reduce signal distortions of signals transmitted through the second signal line SL2, the time margin characteristic may be improved, and thus, high-speed operation may be performed.

Figure 12:
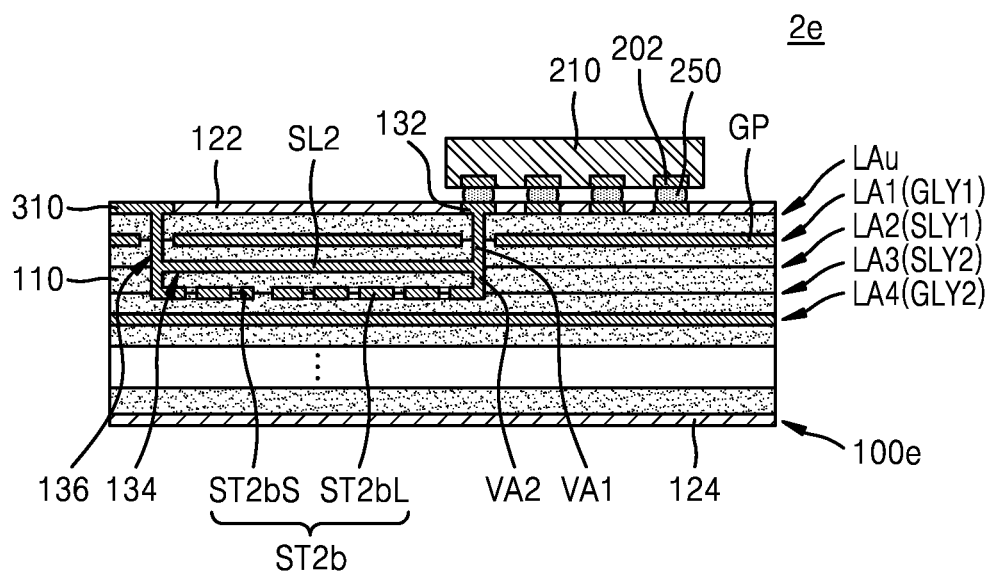

Referring to FIG. 12, an electronic apparatus 2e includes the base substrate 100e, the controller chip 210 mounted on the base substrate 100e, and the input/output terminal 310. The electronic apparatus 2e shown in FIG. 12 is mostly similar to the electronic apparatus 1e shown in FIGS. 6A to 6C except that the pair of second open stubs ST2a are connected to the second signal line SL2, which connects the input/output terminal 310 to the controller chip 210, through the second vias VA2. Therefore, detailed descriptions thereof will be omitted.

Figure 13:
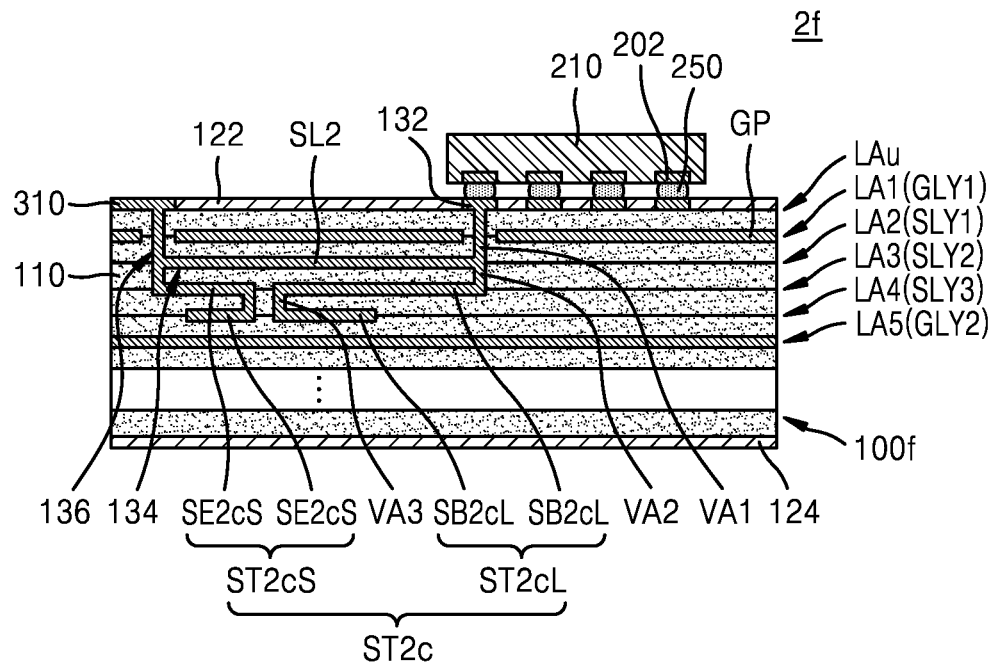

Referring to FIG. 13, an electronic apparatus 2f includes the base substrate 100f, the controller chip 210 mounted on the base substrate 100f, and the input/output terminal 310. The electronic apparatus 2f shown in FIG. 13 is mostly similar to the electronic apparatus 1f shown in FIGS. 7A to 7C except that the pair of second open stubs ST2b are connected to the second signal line SL2, which connects the input/output terminal 310 to the controller chip 210, through the second vias VA2. Therefore, detailed descriptions thereof will be omitted.

Figure 14:
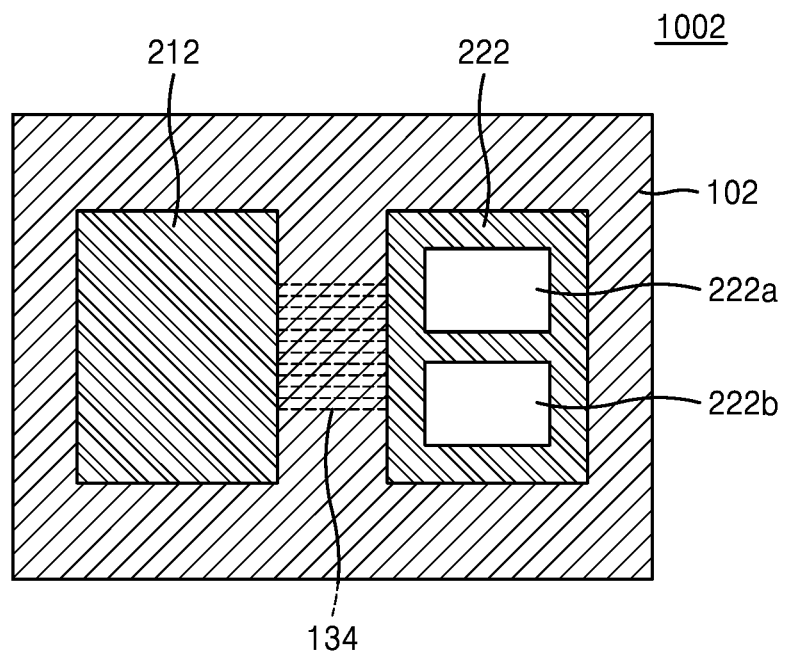
FIG. 14 is a plan view of main components of an electronic apparatus according to an example embodiment.

FIG. 14 is a plan view of main components of an electronic apparatus according to an example embodiment.

Referring to FIG. 14, an electronic apparatus 1002 includes a base substrate 102 and a controller chip 212 and a memory semiconductor chip 222 mounted on the base substrate 102.

The wiring patterns 134 may be disposed in the base substrate 102. The controller chip 212 may be, for example, an application processor (AP), and the memory semiconductor chip 222 may be, for example, an embedded multi-chip package.

The memory semiconductor chip 222 may include a first memory 222a and a second memory 222b in one package. The first memory 222a may be, for example, an embedded multimedia card (eMMC), and the second memory 222b may be, for example, a mobile DRAM.

The first memory 222a may include a non-volatile memory device and a memory controller. The memory controller may be connected to the non-volatile memory device via at least one channel. The memory controller may include at least one controller core, a host interface, and a memory interface. The at least one controller core may control the overall operation of the first memory 222a. The host interface may interface between the memory controller and the host. The host interface may be a parallel interface like an MMC interface or a serial interface like an Ultra High Speed (UHS) interface or a Universal Flash Storage (UFS) interface. According to some example embodiments, the host interface may be a NAND interface.

The controller chip 212 and the memory semiconductor chip 222 may be connected to the controller chip 210 through the wiring patterns 134. At least some of the wiring patterns 134 may be connected to a pair of first open stubs (ST1a, ST1b, or ST1c of FIGS. 2A to 4C) or a pair of second open stubs (ST2a, ST2b, or ST2c of FIGS. 5A to 7A). Since the detailed descriptions of the pair of first open stubs ST1a, ST1b, and ST1c and the pair of second open stubs ST2a, ST2b, and ST2c have been given above with reference to FIGS. 2A to 7C, detailed descriptions thereof will be omitted.

Figure 15:
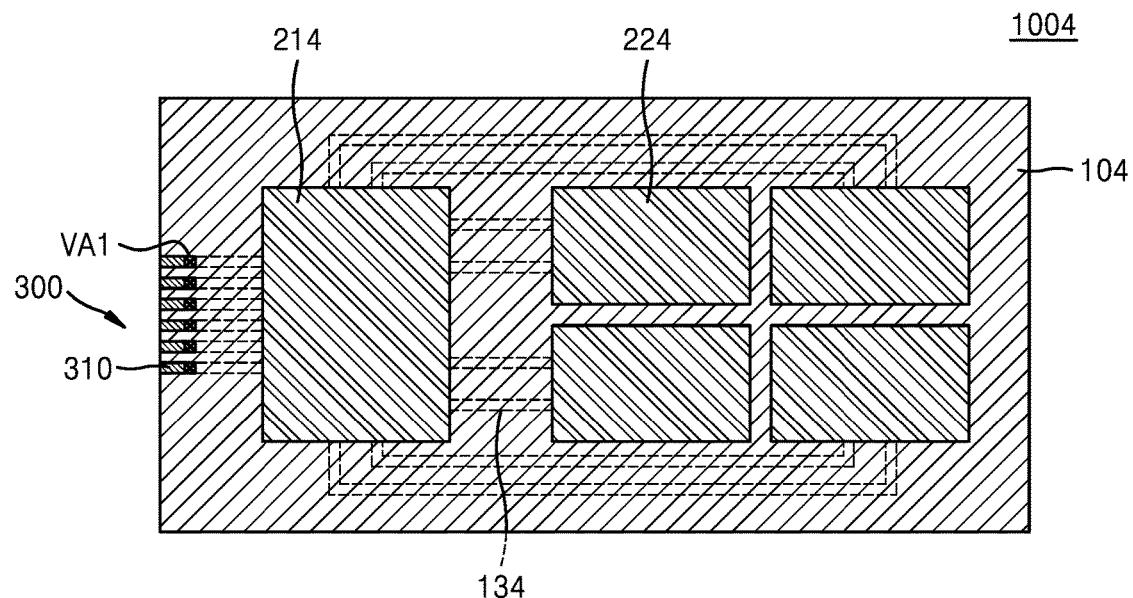
FIG. 15 is a plan view of main components of an electronic apparatus according to an example embodiment.

FIG. 15 is a plan view of main components of an electronic apparatus according to an example embodiment.

Referring to FIG. 15, an electronic apparatus 1004 includes a base substrate 104, a controller chip 214 mounted on the base substrate 104, a plurality of memory semiconductor chips 224, and the input/output interface 300. According to some example embodiments, the electronic apparatus 1004 may be a memory module.

The wiring patterns 134 may be disposed in the base substrate 104. The input/output interface 300 may include a plurality of input/output terminals 310. The input/output terminals 310 and the wiring patterns 134 may be electrically connected through the first vias VA1 that penetrate through portions of the base substrate 104.

The controller chip 214 and the memory semiconductor chips 224 may be connected to each other through the wiring patterns 134 in parallel.

A pair of first open stubs (ST1a, ST1b, or ST1c in FIGS. 2a to 4c and FIGS. 8 to 10) or a pair of second open stubs (ST2a, ST2b, or ST2c in FIGS. 5A to 7A and FIGS. 11 to 13) may be connected to some of the wiring patterns 134. Since the detailed descriptions of the pair of first open stubs ST1a, ST1b, and ST1c and the pair of second open stubs ST2a, ST2b, and ST2c have been given above with reference to FIGS. 2A to 13, detailed descriptions thereof will be omitted.

Figure 16:
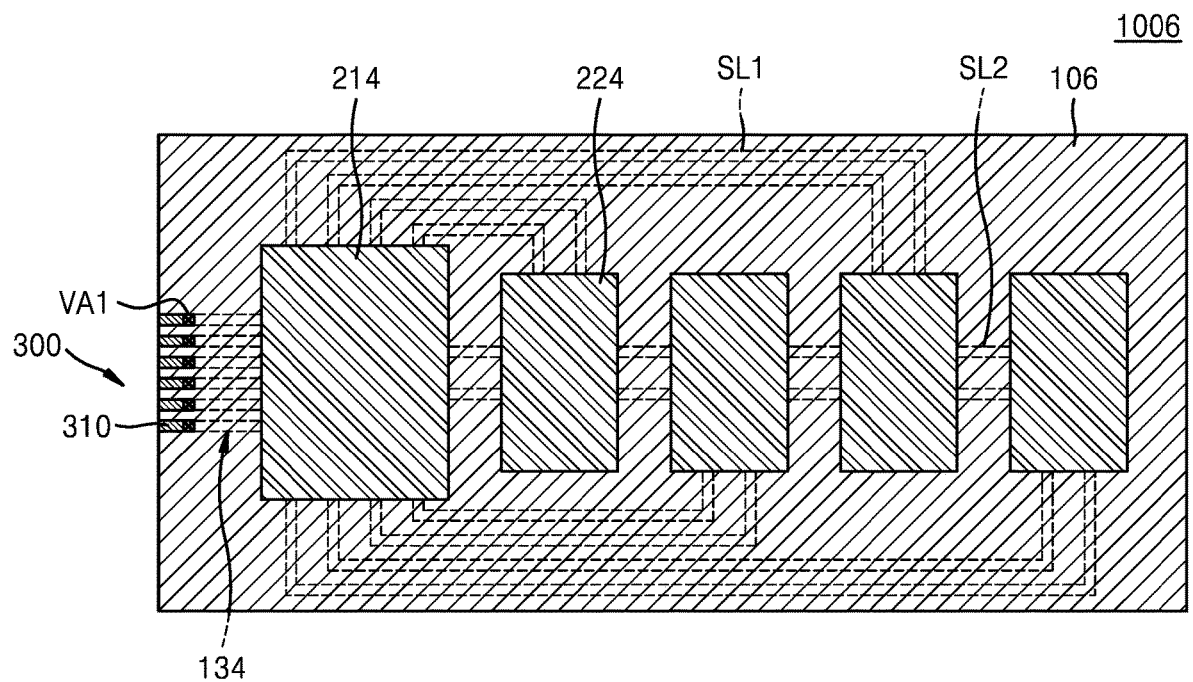
FIG. 16 is a plan view of main components of an electronic apparatus according to an example embodiment.

FIG. 16 is a plan view of main components of an electronic apparatus according to an example embodiment.

Referring to FIG. 16, an electronic apparatus 1006 includes a base substrate 106, the controller chip 214 mounted on the base substrate 106, the memory semiconductor chips 224, and the input/output interface 300. According to some example embodiments, the electronic apparatus 1006 may be a memory module.

The wiring patterns 134 may be disposed in the base substrate 106. The input/output interface 300 may include a plurality of input/output terminals 310. The input/output terminals 310 and the wiring patterns 134 may be electrically connected through the first vias VA1 that penetrate through portions of the base substrate 106.

The controller chip 214 and the memory semiconductor chips 224 may be connected to each other in parallel through the first signal line SL1, which is a portion of the wiring patterns 134. In other words, the controller chip 214 may be directly connected to each of the memory semiconductor chips 224 through the first signal line SL1. The controller chip 214 and the memory semiconductor chips 224 may also be connected in series through the second signal line SL2, which is another portion of the wiring patterns 134. In other words, the controller chip 214 may be directly connected to one of the memory semiconductor chips 224 and indirectly connected to the other memory semiconductor chips 224 through the directly connected memory semiconductor chip 224, through the second signal line SL2.

A pair of first open stubs (ST1a, ST1b, or ST1c in FIGS. 2a to 4c and FIGS. 8 to 10) or a pair of second open stubs (ST2a, ST2b, or ST2c in FIGS. 5A to 7A and FIGS. 11 to 13) may be connected to some of the wiring patterns 134.

For example, the pair of first open stubs ST1a, ST1b, or ST1c may be connected to the first signal line SL1, and the pair of second open stubs ST2a, ST2b, or ST2c may be connected to the second signal line SL2.

Since the detailed descriptions of the pair of first open stubs ST1a, ST1b, and ST1c and the pair of second open stubs ST2a, ST2b, and ST2c have been given above with reference to FIGS. 2A to 13, detailed descriptions thereof will be omitted.

Figure 17:
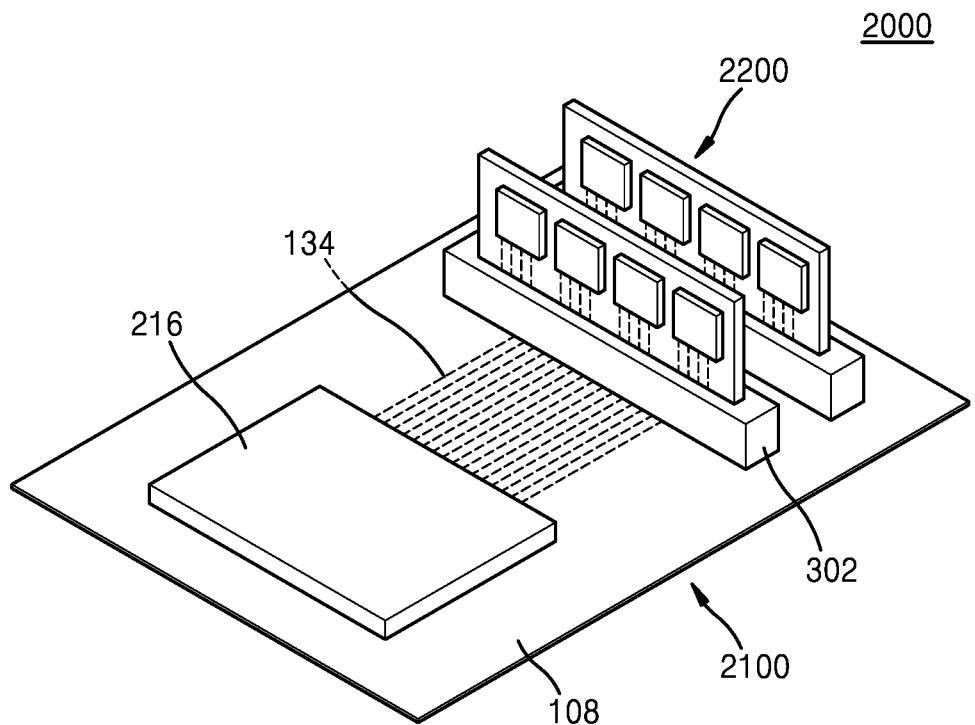
FIG. 17 is a plan view of main components of an electronic apparatus according to an example embodiment.

FIG. 17 is a plan view of main components of an electronic apparatus according to an example embodiment.

Referring to FIG. 17, an electronic apparatus 2000 includes a mainboard 2100 and at least one memory module 2200 connected to the mainboard 2100.

The mainboard 2100 includes a base substrate 108 and a controller chip 216 mounted on the base substrate 108. Since the configuration of the base substrate 108 is mostly similar to those of the base substrates 100, 100a, 100b, 100c, 100d, 100e, and 100f shown in FIGS. 1A to 7C, detailed descriptions thereof will be omitted. The wiring patterns 134 may be disposed in the base substrate 108. The controller chip 216 may be, for example, a central processing unit (CPU).

At least one memory slot 302, which is connected to the base substrate 108, may be disposed in the mainboard 2100. The at least one memory module 2200 may be coupled to the at least one memory slot 302, thereby being connected to the mainboard 2100.

The at least one memory module 2200 may be, for example, the electronic apparatus 1004 shown in FIG. 15 or the electronic apparatus 1006 shown in FIG. 16.

The controller chip 216 and the at least one memory slot 302 may be connected to each other through the wiring patterns 134.

The pair of first open stubs ST1a, ST1b, or ST1c described above with reference to FIGS. 2A to 4C and FIGS. 8 to 10 or the pair of second open stubs ST2a, ST2b, or ST2c described above with reference to FIGS. 5A to 7A and FIGS. 11 to 13 may be connected to some of the wiring patterns 134.

FIGS. 18 to 23 are cross-sectional views of portions of electronic apparatuses according to example embodiments. Electronic apparatuses 3a, 3b, 3c, 3d, 3e, and 3f of FIGS. 18 to 23 may be portions of the electronic apparatus 2000 shown in FIG. 17, for example.

Figure 18:
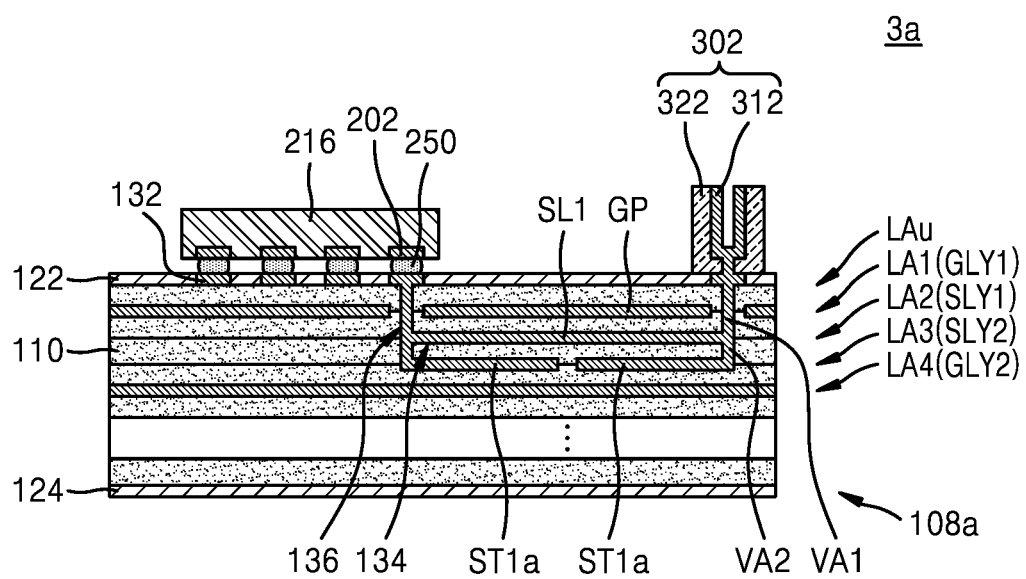
FIGS. 18 to 23 are cross-sectional views of portions of electronic apparatuses according to example embodiments.

Referring to FIG. 18, an electronic apparatus 3a includes a base substrate 108a, the controller chip 216 mounted on the base substrate 108a, and the at least one memory slot 302. The at least one memory slot 302 may include a terminal 312 and a slot body 322 that supports the terminal 312. The memory module 2200 shown in FIG. 17 may be electrically connected to the terminal 312, is supported by the slot body 322, and may be connected to the electronic apparatus 3a.

The first signal line SL1 may electrically connect the controller chip 216 to the terminal 312 of the memory slot 302. The pair of first open stubs ST1a may be connected to the first signal line SL1, which connects the controller chip 216 to the terminal 312, through the second via VA2. Since the configuration of the pair of first open stubs ST1a of the electronic apparatus 3a is similar to that of the pair of first open stubs ST1a of the electronic apparatus 1a shown in FIGS. 2A to 2C, detailed descriptions thereof will be omitted.

Figure 19:
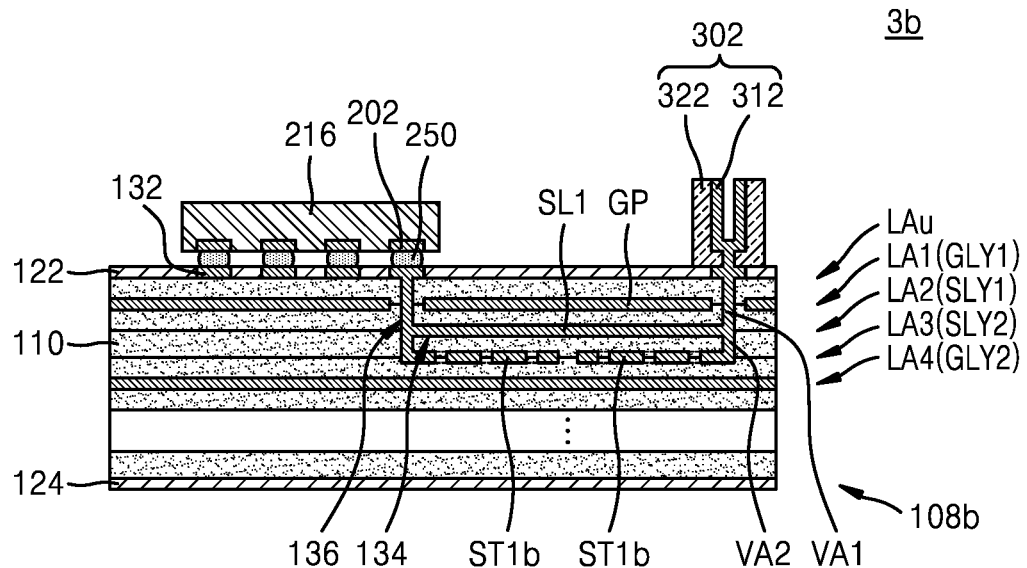

Referring to FIG. 19, an electronic apparatus 3b includes a base substrate 108b, the controller chip 216 mounted on the base substrate 108b, and the at least one memory slot 302. The at least one memory slot 302 may include the terminal 312 and the slot body 322 that supports the terminal 312.

The first signal line SL1 may electrically connect the controller chip 216 to the terminal 312 of the memory slot 302. The pair of first open stubs ST1b may be connected to the first signal line SL1, which connects the controller chip 216 to the terminal 312, through the second via VA2. Since the configuration of the pair of first open stubs ST1b of the electronic apparatus 3b is similar to that of the pair of first open stubs ST1b of the electronic apparatus 1b shown in FIGS. 3A to 3C, detailed descriptions thereof will be omitted.

Figure 20:
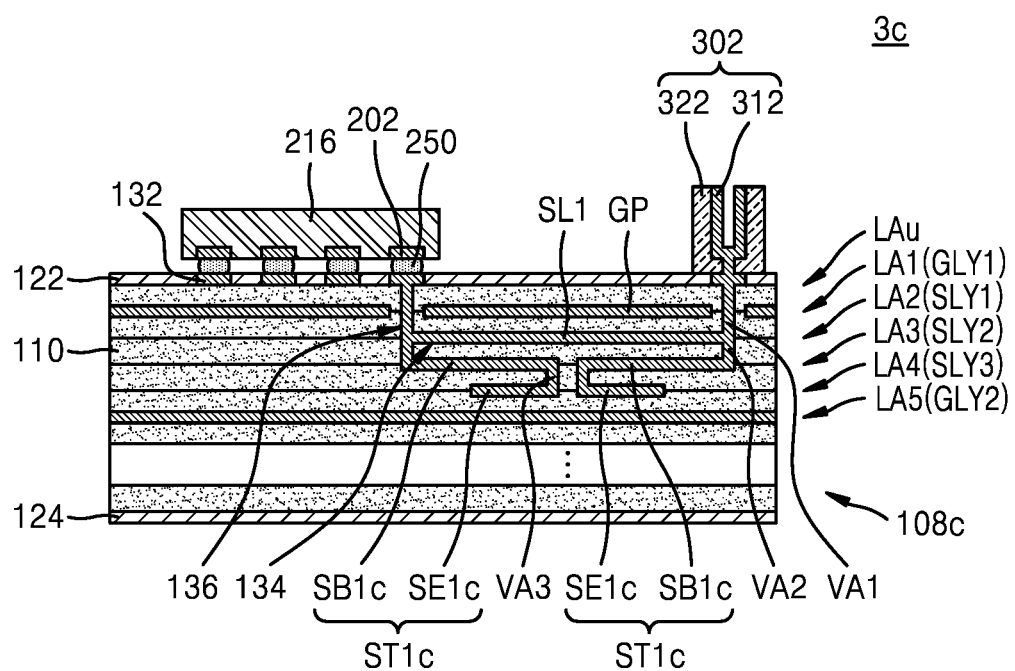

Referring to FIG. 20, an electronic apparatus 3c includes a base substrate 108c, the controller chip 216 mounted on the base substrate 108c, and the at least one memory slot 302. The at least one memory slot 302 may include the terminal 312 and the slot body 322 that supports the terminal 312.

The first signal line SL1 may electrically connect the controller chip 216 to the terminal unit 312 of the memory slot 302. The pair of first open stubs ST1c may be connected to the first signal line SL1, which connects the controller chip 216 to the terminal 312, through the second via VA2. Since the configuration of the pair of first open stubs ST1c of the electronic apparatus 3c is similar to that of the pair of first open stubs ST1c of the electronic apparatus 1c shown in FIGS. 4A to 4C, detailed descriptions thereof will be omitted.

Figure 21:
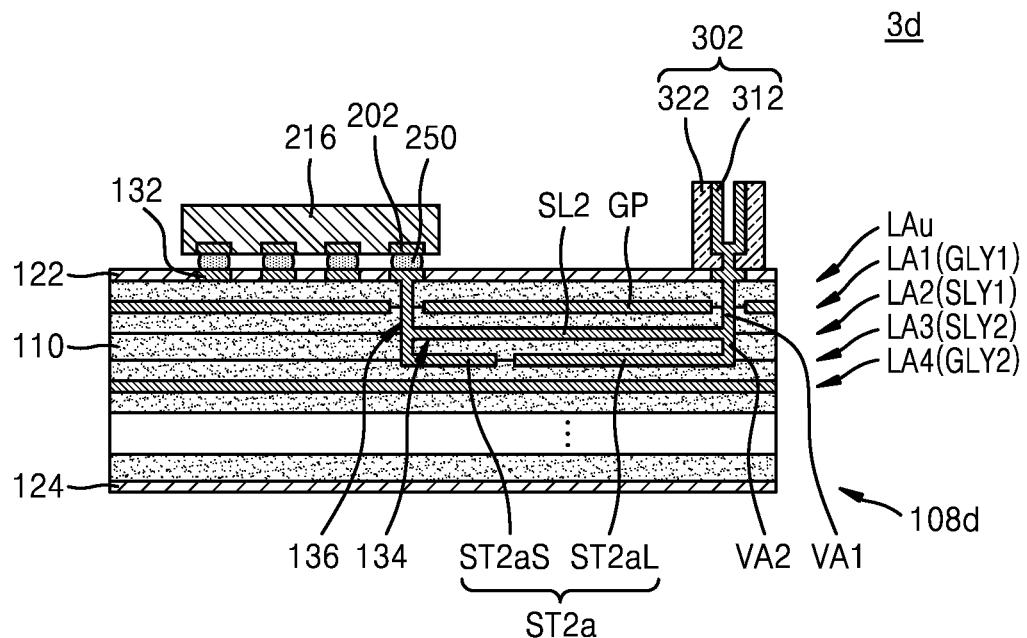

Referring to FIG. 21, an electronic apparatus 3d includes a base substrate 108d, the controller chip 216 mounted on the base substrate 108d, and the at least one memory slot 302. The at least one memory slot 302 may include the terminal 312 and the slot body 322 that supports the terminal 312.

The second signal line SL2 may electrically connect the controller chip 216 to the terminal 312 of the memory slot 302. The pair of second open stubs ST2a may be connected to the second signal line SL2, which connects the controller chip 216 to the terminal 312, through the second via VA2. Since the configuration of the pair of first open stubs ST2a of the electronic apparatus 3d is similar to that of the pair of first open stubs ST2a of the electronic apparatus 1d shown in FIGS. 5A to 5C, detailed descriptions thereof will be omitted.

Figure 22:
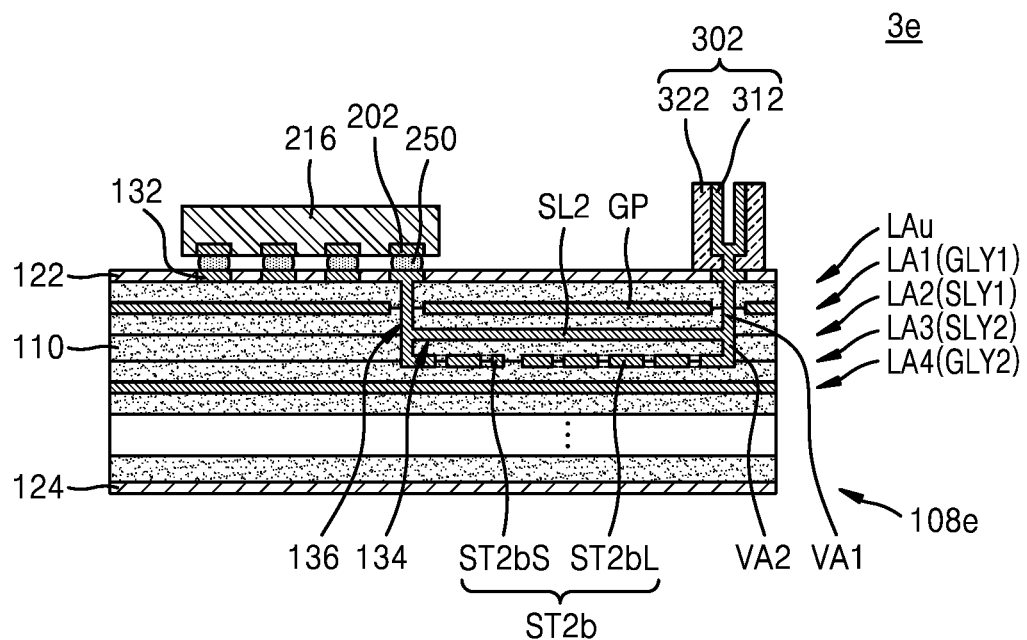

Referring to FIG. 22, an electronic apparatus 3e includes a base substrate 108e, the controller chip 216 mounted on the base substrate 108e, and the at least one memory slot 302. The at least one memory slot 302 may include the terminal 312 and the slot body 322 that supports the terminal 312.

The second signal line SL2 may electrically connect between the controller chip 216 to the terminal 312 of the memory slot 302. The pair of second open stubs ST2b may be connected to the second signal line SL2, which connects the controller chip 216 to the terminal 312, through the second via VA2. Since the configuration of the pair of first open stubs ST2b of the electronic apparatus 3e is similar to that of the pair of first open stubs ST2*b* of the electronic apparatus 1*e* shown in FIGS. 6A to 6C, detailed descriptions thereof will be omitted.

Figure 23:
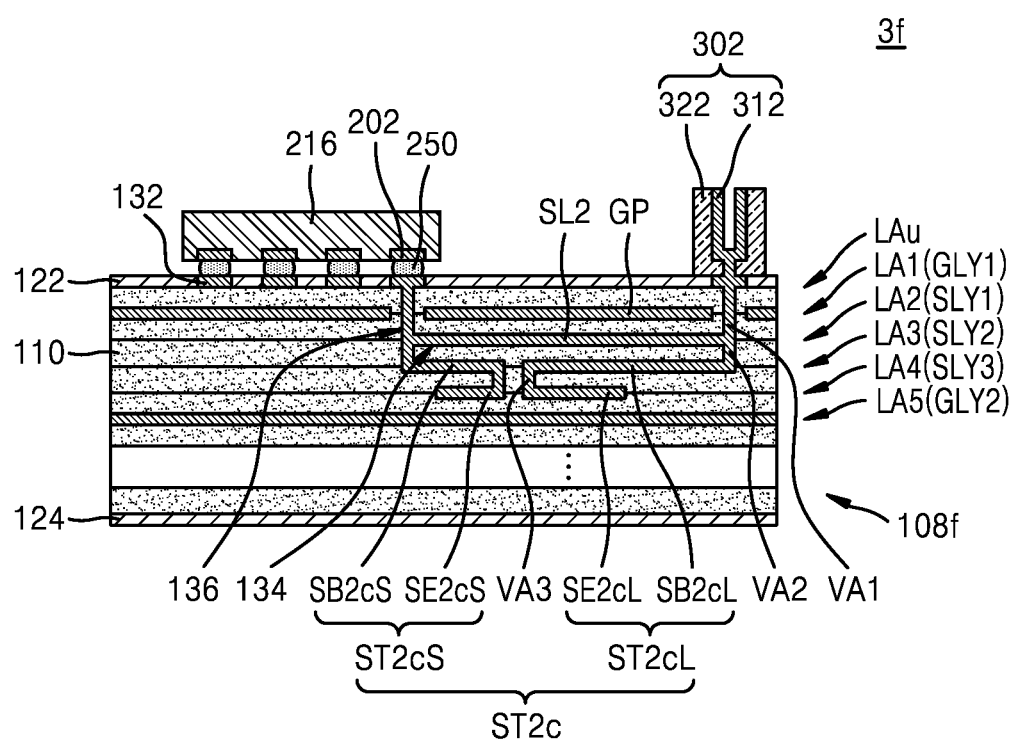

Referring to FIG. 23, an electronic apparatus 3*f* includes a base substrate 108*f*, the controller chip 216 mounted on the base substrate 108*f*, and the at least one memory slot 302. The at least one memory slot 302 may include the terminal 312 and the slot body 322 that supports the terminal 312.

The second signal line SL2 may electrically connect the controller chip 216 to the terminal 312 of the memory slot 302. The pair of second open stubs ST2*f* may be connected to the second signal line SL2, which connects the controller chip 216 and the terminal 312, through the second via VA2. Since the configuration of the pair of first open stubs ST2*c* of the electronic apparatus 3*f* is similar to that of the pair of first open stubs ST2*c* of the electronic apparatus 1*f* shown in FIGS. 7A to 7C, detailed descriptions thereof will be omitted.

Figure 24A:
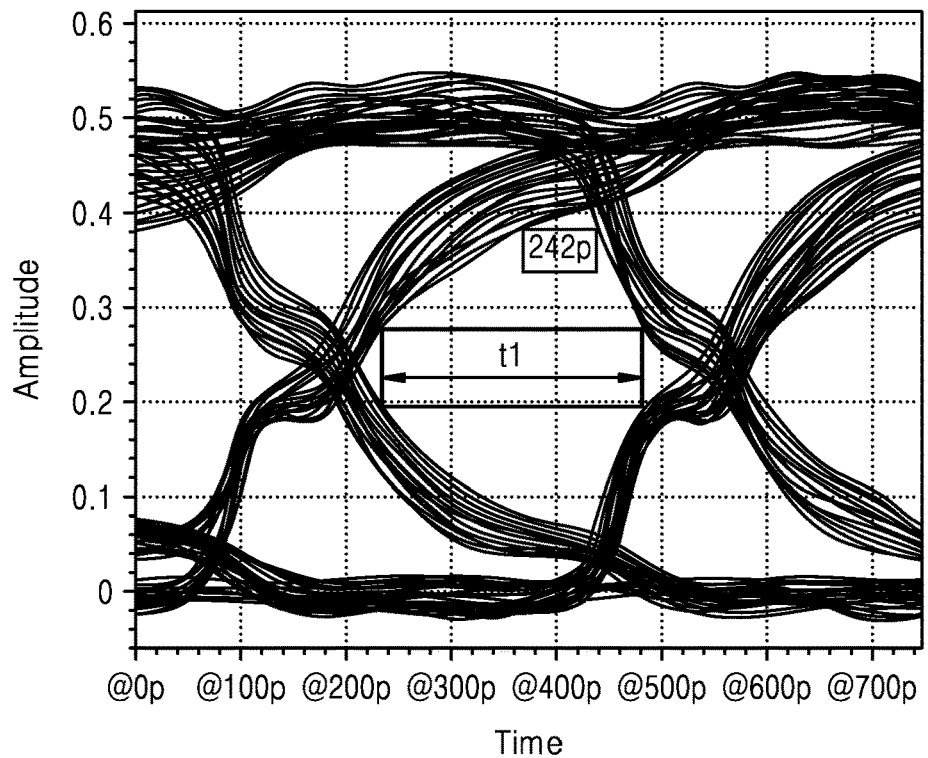
FIGS. 24A and 24B are signal eye diagrams of electronic apparatuses according to a comparative embodiment and an example embodiment, respectively.
Figure 24B:
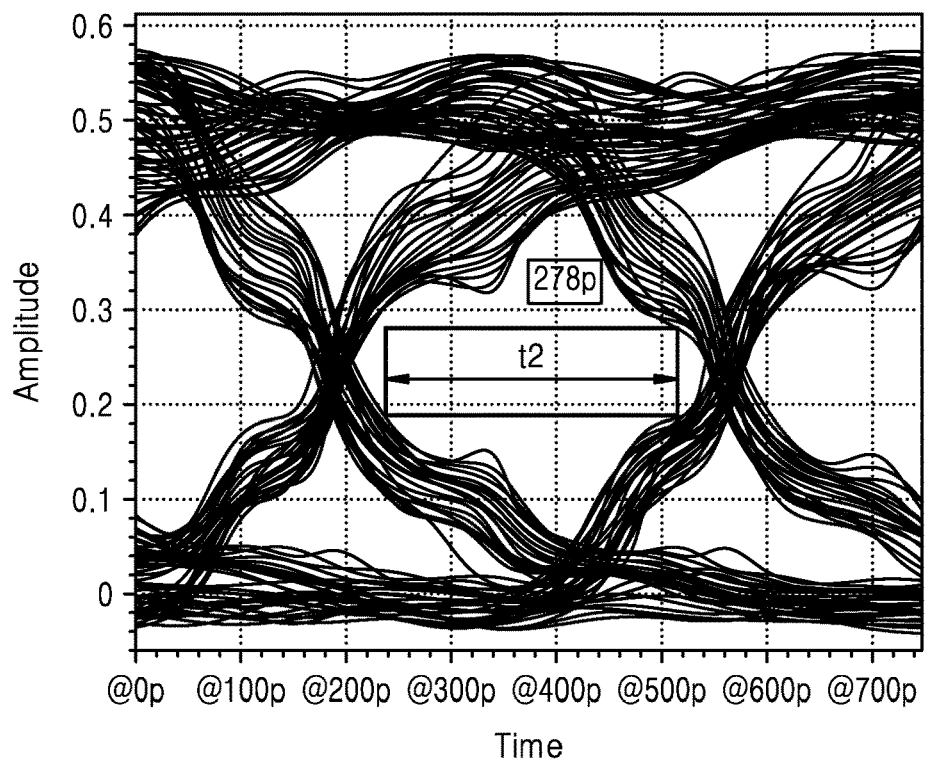

FIGS. 24A and 24B are signal eye diagrams of electronic apparatuses according to a comparative embodiment and an example embodiment, respectively.

Referring to FIGS. 24A and 24B, unlike an electronic apparatus according to an example embodiment, an electronic apparatus according to the comparative example does not include a first open stub (ST1*a*, ST1*b*, or ST1*c* in FIGS. 2A to 4C and FIGS. 8 to 10) and/or a second open stub (ST2*a*, ST2*b*, or ST2*c* in FIGS. 5A to 7A and FIGS. 11 to 13).

The size (more particularly, a width t2) of an eye opening of an eye pattern in the signal eye diagram of the electronic apparatus according to an example embodiment is greater than the size (more particularly, a width t1) of an eye opening of an eye pattern in the signal eye diagram of the electronic apparatus according to the comparative embodiment.

Accordingly, an electronic apparatus according to an example embodiment has improved time margin, and thus, the electronic apparatus may have high-speed operation characteristics. Particularly, in an electronic apparatus according to an example embodiment, a pair of open stubs having a shape similar to that of a signal line may be formed by adding only one or two wiring layers to a base substrate without using an active element consuming power, and thus, the electronic apparatus may easily have high-speed operation characteristics without additional power consumption.

While the inventive concept has been particularly shown and described with reference to example embodiments thereof, it will be understood that various changes in form and details may be made therein without departing from the spirit and scope of the inventive concept represented by the following claims.

What is claimed is:

1. An electronic apparatus comprising:
a base substrate comprising a substrate base comprising a plurality of layers and a plurality of wiring layers disposed between the layers;
a controller chip and at least one memory semiconductor chip mounted on the base substrate;
at least one first signal line disposed in a first wiring layer in the substrate base from among the wiring layers and connecting the controller chip to the memory semiconductor chip;
at least one pair of open stubs disposed in a second wiring layer in the substrate base from among the wiring layers, connected to both ends of the first signal line, electrically connected to each other, and apart from each other; and
a plurality of vias penetrating through portions of the substrate base to connect both ends of the first signal line and the pair of open stubs,
wherein a first end of each of the at least one pair of open stubs is connected a corresponding first signal line of the at least one first signal line, and a second end of each of the at least one pair of open stubs faces the other of the at least one pair of open stubs across a gap.

2. The electronic apparatus of claim 1, wherein the memory semiconductor chip comprises a plurality of memory semiconductor chips, and the first signal line comprises a plurality of first signal lines, and
wherein the controller chip is connected to the memory semiconductor chips in parallel through the first signal lines.

3. The electronic apparatus of claim 1, wherein an extension length of one of the pair of open stubs is the same as an extension length of the other of the pair of open stubs, and a sum of the extension lengths of the pair of open stubs is less than an extension length of the first signal line.

4. The electronic apparatus of claim 1, further comprising at least one second signal line,
wherein the memory semiconductor chip comprises a plurality of memory semiconductor chips, and the first signal line comprises a plurality of first signal lines,
wherein the controller chip is connected to the memory semiconductor chips in parallel through the first signal lines, and
wherein the controller chip is connected to the memory semiconductor chips in series through the second signal line.

5. The electronic apparatus of claim 4, wherein the pair of open stubs comprises a pair of first open stubs connected to the first signal line and a pair of second open stubs connected to the second signal line, and
wherein an extension length of one of the pair of first open stubs is the same as an extension length of the other of the pair of first open stubs, and an extension length of one of the pair of second open stubs is different from an extension length of the other of the pair of second open stubs.

6. An electronic apparatus comprising:
a base substrate comprising a substrate base comprising a plurality of layers and a plurality of wiring layers disposed between the layers, wherein the layers comprise a first ground wiring layer, a second ground wiring layer, a first signal wiring layer, and a second signal wiring layer, and wherein the first signal wiring layer and the second signal wiring layer are disposed between the first ground wiring layer and the second ground wiring layer; and
a plurality of semiconductor chips mounted on the base substrate,
wherein the base substrate comprises:
ground plane layers respectively disposed in the first ground wiring layer and the second ground wiring layer;
a signal line disposed in the first signal wiring layer and connecting two of the semiconductor chips;
a pair of open stubs disposed in the second signal wiring layer, connected to both ends of the signal line, and electrically connected to each other; and
a plurality of vias penetrating a portion of the substrate base to connect both ends of the signal line and the pair of open stubs, wherein each of the pair of open stubs comprises a first end connected to one of the vias and a second end facing the other of the pair of open stubs across a gap.

7. The electronic apparatus of claim 6, wherein the second end of each of the pair of open stubs is opened without being connected to other electric paths.

8. The electronic apparatus of claim 7, wherein an extension length of one of the pair of open stubs is the same as or different from an extension length of the other of the pair of open stubs, and a sum of the extension lengths of the pair of open stubs is less than an extension length of the signal line.

9. An electronic apparatus comprising:
a base substrate comprising a substrate base comprising a plurality of layers and a plurality of wiring layers disposed between the layers;
at least one semiconductor chip mounted on the base substrate;
at least one signal line disposed in a first wiring layer among the wiring layers and connected to the at least one semiconductor chip;
a pair of open stubs disposed in at least one second wiring layer among the wiring layers, connected to both ends of the signal line, electrically connected to each other, and extending to face each other across a gap;
first vias penetrating through portions of the substrate base between a top surface of the substrate base and the first wiring layer and connected to both ends of the signal line; and
second vias penetrating through other portions of the substrate base between the first wiring layer and the second wiring layer and connecting both ends of the signal line to the pair of open stubs,
wherein each of the pair of open stubs comprises a first end connected to the second vias and a second end facing the other of the pair of open stubs across the gap and opened without being connected to other electric paths.

10. The electronic apparatus of claim 9, wherein an extension length of one of the pair of open stubs is the same as an extension length of the other of the pair of open stubs.

11. The electronic apparatus of claim 9, wherein the first vias and the second vias overlap in a vertical direction.

12. The electronic apparatus of claim 9, wherein the pair of open stubs overlap the signal line in the vertical direction.

13. The electronic apparatus of claim 9, wherein the at least one semiconductor chip comprises a controller chip and at least one memory semiconductor chip, and wherein the signal line connects the controller chip to the memory semiconductor chip.

14. The electronic apparatus of claim 9, wherein a sum of extension lengths of the pair of open stubs is equal to twice an extension length of the signal line or is greater than the extension length of the signal line.

15. The electronic apparatus of claim 13, wherein the signal line comprises a first signal line and a second signal line,
wherein the pair of open stubs comprises a pair of first open stubs connected to the first signal line and a pair of second open stubs connected to the second signal line, and
wherein a ratio of extension lengths of the pair of first open stubs is different from a ratio of extension lengths of the pair of second open stubs.

16. The electronic apparatus of claim 14, wherein each of the pair of open stubs is bent or takes a convex and/or concave form.

17. The electronic apparatus of claim 14, wherein each of the pair of open stubs comprise a base open stub and an extended open stub connected to each other through a via, and
wherein the base open stub and the extended open stub are disposed in two different wiring layers of the second wiring layer.

18. The electronic apparatus of claim 15, wherein the first signal line transmits signals in both directions between the controller chip and the memory semiconductor chip, and the second signal line transmits signals in one direction between the controller chip and the memory semiconductor chip, and
wherein an extension length of one of the pair of first open stubs is the same as an extension length of the other of the pair of first open stubs, and an extension length of one of the pair of second open stubs is different from an extension length of the other of the pair of second open stubs.

19. The electronic apparatus of claim 18, wherein the pair of second open stubs comprises:
a second short open stub connected to a first end of the second signal line, which is connected to one of the controller chip and the memory semiconductor chip;
a second long open stub, having an extension length greater than an extension length of second short open stub, and connected to a second end of the second signal line which is connected to the other of the controller chip and the memory semiconductor chip.

* * * * *